United States Patent
Kimura et al.

(10) Patent No.: US 9,508,611 B2
(45) Date of Patent: Nov. 29, 2016

(54) SEMICONDUCTOR INSPECTION METHOD, SEMICONDUCTOR INSPECTION DEVICE AND MANUFACTURING METHOD OF SEMICONDUCTOR ELEMENT

(71) Applicant: HITACHI, LTD., Chiyoda-ku, Tokyo (JP)

(72) Inventors: Yoshinobu Kimura, Tokyo (JP); Natsuki Tsuno, Tokyo (JP); Hiroya Ohta, Tokyo (JP); Renichi Yamada, Tokyo (JP); Hirotaka Hamamura, Tokyo (JP); Toshiyuki Ohno, Tokyo (JP); Hiroyuki Okino, Tokyo (JP); Yuki Mori, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/911,651

(22) PCT Filed: Aug. 14, 2013

(86) PCT No.: PCT/JP2013/071929
§ 371 (c)(1),
(2) Date: Feb. 11, 2016

(87) PCT Pub. No.: WO2015/022739
PCT Pub. Date: Feb. 19, 2015

(65) Prior Publication Data
US 2016/0190020 A1    Jun. 30, 2016

(51) Int. Cl.
*H01L 21/66* (2006.01)
*G01R 31/265* (2006.01)

(52) U.S. Cl.
CPC ............. *H01L 22/12* (2013.01); *G01R 31/265* (2013.01); *H01L 22/24* (2013.01)

(58) Field of Classification Search
CPC ....... H01L 22/12; H01L 22/24; G01R 31/265; G01R 31/2653; G01R 31/307
See application file for complete search history.

(56) References Cited

U.S. PATENT DOCUMENTS

2014/0084159 A1*  3/2014  Yaeshima ............... H01L 22/12
                                                          250/310

FOREIGN PATENT DOCUMENTS

JP    2009-044083 A    2/2009
JP    2011-211035 A    10/2011

* cited by examiner

*Primary Examiner* — Daniel Shook
(74) *Attorney, Agent, or Firm* — Miles & Stockbridge P.C.

(57) ABSTRACT

In a semiconductor inspection method using a semiconductor inspection device, by selecting an incident energy and a negative potential and scanning an inspection surface of a wafer with primary electrons to detect secondary electrons, a first inspection image is acquired, and a macro defect, stacking faults, a basal plane dislocation and a threading dislocation contained in the first inspection image are discriminated by image processing based on a threshold value of a signal amount of the secondary electrons determined in advance. Moreover, by selecting the incident energy and a positive potential and scanning the inspection surface of the wafer with primary electrons to detect the secondary electrons, a second inspection image is acquired, and a threading screw dislocation of a dot-shaped figure contained in the second inspection image is discriminated by image processing based on a threshold value of a signal amount of the secondary electrons determined in advance.

15 Claims, 14 Drawing Sheets

FIG. 3

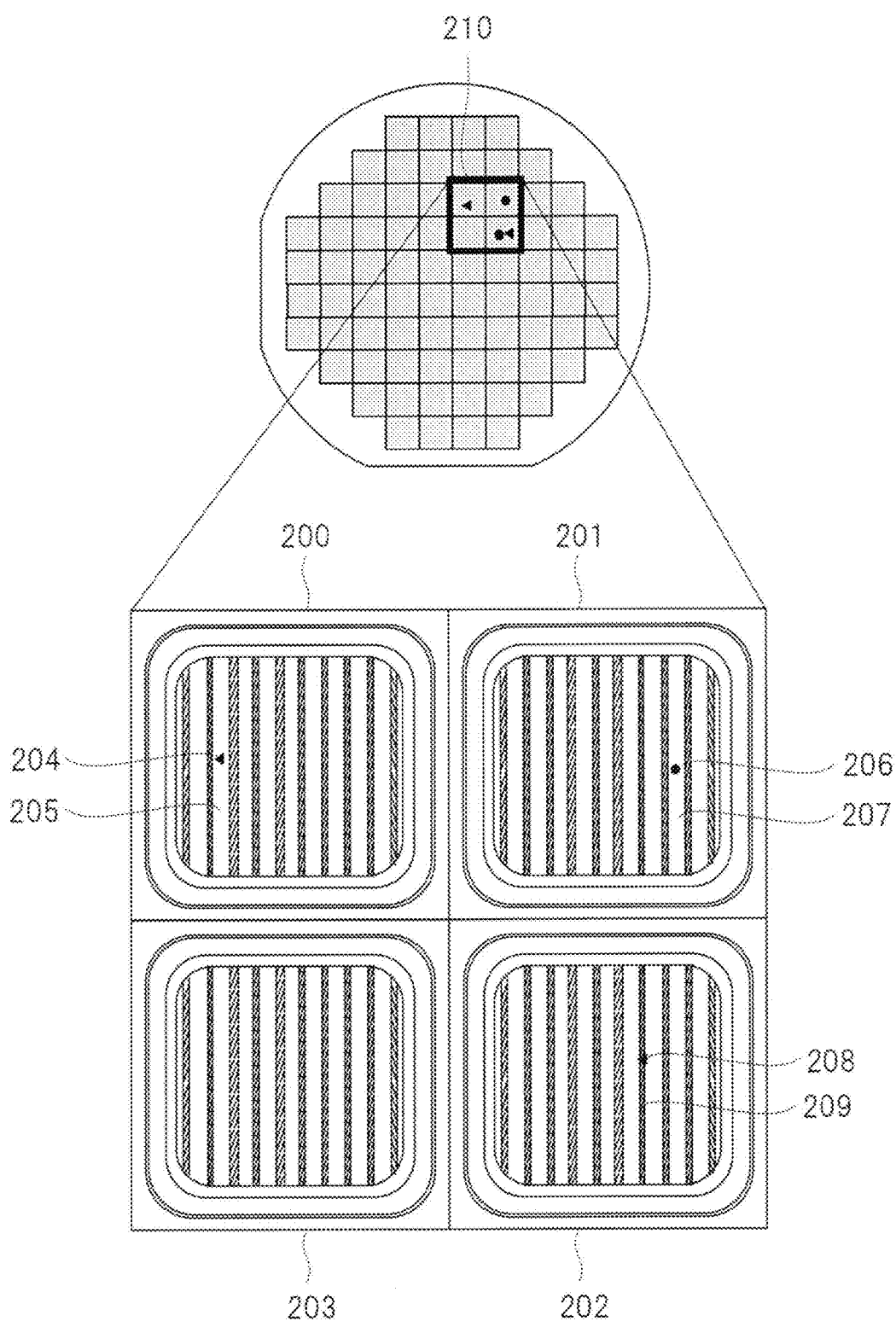

SEMICONDUCTOR INSPECTION METHOD, SEMICONDUCTOR INSPECTION DEVICE AND MANUFACTURING METHOD OF SEMICONDUCTOR ELEMENT

TECHNICAL FIELD

The present invention relates to an inspection technique of a semiconductor wafer, and in particular, relates to an inspection method and an inspection device which detect defects of a single crystal wafer or a single crystal wafer with an epitaxial layer formed thereon and discriminate the defects in a semiconductor inspection technique using a charged particle beam. Moreover, the present invention relates to a manufacturing method of a semiconductor element using this inspection technique.

BACKGROUND ART

In a semiconductor element formed by using a semiconductor wafer, macro defects (shape defects) (irregularities, triangular defects, micro pipes, carrots, comets, downfalls and step bunching) and crystal defects (threading screw dislocation, threading edge dislocation and stacking faults) of a semiconductor wafer give serious influences to the performance, yield and reliability of the element. In particular, a silicon carbide wafer for use in a power controlling semiconductor element contains macro defects and crystal defects, and it is very important to inspect the defects of a wafer prior to the fabrication of a semiconductor element. Therefore, the inspection should be a non-destructive inspection and needs to be carried out under the condition that gives no influence to the fabrication of the element.

It is difficult to form a silicon carbide wafer by a fusing method unlike a silicon wafer, and the silicon carbide wafer is formed by the crystal growth using a sublimation method and a chemical vapor deposition method. Consequently, it is very difficult to eliminate crystal defects in the current technique, and threading dislocations (threading edge dislocations and threading screw dislocations) having a density of $10^3$ cm$^{-2}$ to $10^4$ cm$^{-2}$ and basal plane defects (basal plane dislocations and stacking faults) having a dislocation density of 1 cm$^{-2}$ or less are present. Moreover, in addition to the crystal defects, macro defects to which the surface shape is reflected are present at a dislocation density of 1 cm$^{-2}$ or less. The macro defects can be inspected and measured by a method using an optical microscope. Furthermore, a technique for suppressing the occurrence of macro defects by utilizing a wafer planarization technique and an epitaxial growth technique has been developed.

The semiconductor element for use in power control is fabricated in the regions divided into dies, each having an area of about 1 mm×1 mm to about 5 mm×5 mm in a wafer plane. Therefore, there are some dies containing the above-mentioned basal plane defects and macro defects and other dies containing no such defects. On the other hand, each die contains $10^2$ to $10^3$ pieces of the above-mentioned threading dislocations.

As a material for the above-mentioned wafer, a silicon carbide wafer and a gallium nitride wafer are used in most cases. As the silicon carbide wafer, a silicon carbide wafer or a wafer having a silicon carbide epitaxial film formed on a silicon carbide wafer is used in most cases. Moreover, as the gallium nitride wafer, a wafer having a film formed by epitaxial growth on a silicon wafer, a sapphire wafer or a silicon nitride wafer is used in most cases. Furthermore, also in the silicon carbide wafer or the gallium nitride wafer, it is important to inspect the above-mentioned macro defects and crystal defects. The background art relating to the defect inspection for the silicon carbide wafer will be described below. The same is true for the gallium nitride wafer, unless otherwise specified.

For example, as the methods for inspecting macro defects, optical inspection methods such as those using a differential interference microscope or a laser scattering system have been known. This method can inspect even crystal defects as long as there is a characteristic on the surface shape (see Patent Document 1). Moreover, as the methods for inspecting crystal defects, an X-ray topography (see Patent Document 2), a transmission electron microscope method and an etch pit method have been known. However, the transmission electron microscope method and the etch pit method are inspection methods in which the wafer needs to be destroyed, and are not used for non-destructive inspection. Furthermore, in the case of the detection method using light, the resolution is subjected to the restriction of a wavelength limit of light.

RELATED ART DOCUMENTS

Patent Documents

Patent Document 1: Japanese Patent Application Laid-Open Publication No. 2011-211035
Patent Document 2: Japanese Patent Application Laid-Open Publication No. 2009-44083

SUMMARY OF THE INVENTION

Problems to be Solved by the Invention

In a device such as a semiconductor element using a single crystal wafer such as a silicon carbide wafer or a single crystal wafer with an epitaxial layer formed thereon, it is necessary to detect macro defects such as irregularity defects on a surface and step bunching and crystal defects such as threading dislocations and stacking faults with high accuracy and classify the defects in order to improve the performance, yield and reliability of the device.

Moreover, it is also necessary to know the influences of the various defects given to the performance of the semiconductor element. In particular, those defects causing failures in the initial characteristics and reliability of the semiconductor element need to be discriminated as killer defects (fatal defects). For screening the dies containing defective elements in a post process of the element manufacture, it is necessary to preliminarily know the coordinates and sizes of the killer defects in a wafer.

Furthermore, in the above-mentioned wafer, threading dislocations with a surface density of $10^3$ cm$^{-2}$ to $10^4$ cm$^{-2}$ are present. For this reason, it is necessary to manage the dislocation density in the element region. Also, in the semiconductor element for use in power control, threading dislocations are coincident with a direction of electric current, and thus influences to be given to a drift layer are small, but the withstand voltage failure might be caused at the joint interface. Namely, in the inspection for threading dislocations, in addition to knowing the coordinates of dislocations, it is also necessary to know the electric characteristics and to determine whether or not the threading dislocation is a killer defect.

The defect inspection by an optical method uses a signal depending on a shape abnormality. As in the case of the above-mentioned Patent Document 1, even a crystal defect can be detected if there is a shape abnormality, but no inspection is available when there is no shape abnormality. Although crystal defects can be inspected with high sensitivity and high resolution in the transmission electron microscope method and the etch pit method, a sample needs to be processed or etched by erosion using a chemical solution for the inspection, and thus inspection cannot be carried out in a non-destructive manner in some cases.

Therefore, in order to solve the above-mentioned problems, a typical object of the present invention is to provide an inspection method and an inspection device by which the size and coordinates of a killer defect, the density of threading dislocations and whether or not the threading dislocation is a killer defect can be measured in a non-destructive manner and defective dies can be screened in a pre-process in the manufacture of a semiconductor element, and further provide a manufacturing method of a semiconductor element which gives no influence to element characteristics due to the defects.

The above and other objects and novel characteristics of the present invention will be apparent from the description of the present specification and the accompanying drawings.

Means for Solving the Problems

The following is a brief description of an outline of the typical invention disclosed in the present application.

(1) A typical semiconductor inspection method is a semiconductor inspection method, which inspects a semiconductor wafer by using a semiconductor inspection device that inspects the semiconductor wafer by carrying out an image processing by detecting secondary electrons generated by irradiating the semiconductor wafer with a charged particle beam. The semiconductor wafer is a single crystal wafer or a wafer with an epitaxial layer formed thereon.

The semiconductor inspection method includes: a first step of applying a positive potential or a negative potential determined based on a potential of the semiconductor wafer to a counter electrode provided between the semiconductor wafer and an objective lens; a second step of calculating a secondary electron yield based on the charged particle beam and a current amount of the secondary electrons; a third step of determining an incident energy that makes the secondary electron yield greater than 1, the negative potential that makes the secondary electron yield smaller than 1 and the positive potential that makes the secondary electron yield greater than 1 at the incident energy; a fourth step of selecting the incident energy and the negative potential; a fifth step, which is carried out after the fourth step, of scanning an inspection surface of the semiconductor wafer with the charged particle beam to detect the secondary electrons; and a sixth step of acquiring a first inspection image obtained in the fifth step and discriminating a macro defect, stacking faults, a basal plane dislocation and a threading dislocation contained in the first inspection image based on a threshold value of a signal amount of the secondary electrons determined in advance.

(2) A typical semiconductor inspection device includes: a charged particle gun which generates a charged particle beam; a sample holder which supports a sample; a deflection unit which scans a sample surface with the charged particle beam; a detector which detects secondary electrons generated by irradiating the sample with the charged particle beam; an image processing unit which processes an output from the detector as an image; a sample potential control unit which controls a potential of the sample; a counter electrode provided between the sample and an objective lens; a power supply unit which applies a positive potential or a negative potential determined based on the potential of the sample to the counter electrode; a yield calculation unit which calculates a secondary electron yield based on the charged particle beam and a current amount of the secondary electrons; a calculation unit which calculates an incident energy that makes the secondary electron yield greater than 1, the negative potential that makes the secondary electron yield smaller than 1 and the positive potential that makes the secondary electron yield greater than 1 at the incident energy based on an output of the yield calculation unit; and a control unit which controls the incident energy and an application of the positive potential or the negative potential to the counter electrode depending on measuring conditions of the sample.

The sample is a single crystal wafer or a wafer with an epitaxial layer formed thereon. The control unit controls the charged particle beam so as to have the incident energy and apply the negative potential to the counter electrode, and scans an inspection surface of the sample with the charged particle beam to detect the secondary electrons. The image processing unit acquires a first inspection image obtained by the control of the control unit, and discriminates a macro defect, stacking faults, a basal plane dislocation and a threading dislocation contained in the first inspection image based on a threshold value of a signal amount of the secondary electrons determined in advance.

(3) A typical manufacturing method of a semiconductor element is a manufacturing method of a semiconductor element using a single crystal wafer or a wafer with an epitaxial layer formed thereon. The manufacturing method of a semiconductor element includes the steps of: setting die regions having a lattice pattern in the wafer; and specifying dies containing the macro defect, the stacking faults and the basal plane dislocation and screening the specified dies by using the semiconductor inspection method according to (1) mentioned above.

Effects of the Invention

The effects obtained by typical embodiment of the invention disclosed in the present application will be briefly described below.

Namely, as the typical effects, a plurality of kinds of defects can be detected in a separated manner, defects having high degrees of importance and coordinates thereof can be specified, and dies to be screened can be extracted.

BRIEF DESCRIPTIONS OF THE DRAWINGS

FIG. 3 is a view showing one example of GUI in the semiconductor inspection device of FIG. 1;

FIG. 13 is an explanatory view showing one example of a defect distribution of the first defect group in the manufacturing method of a semiconductor element of FIG. 11.

DETAILED DESCRIPTION OF PREFERRED EMBODIMENTS

Figure 1:
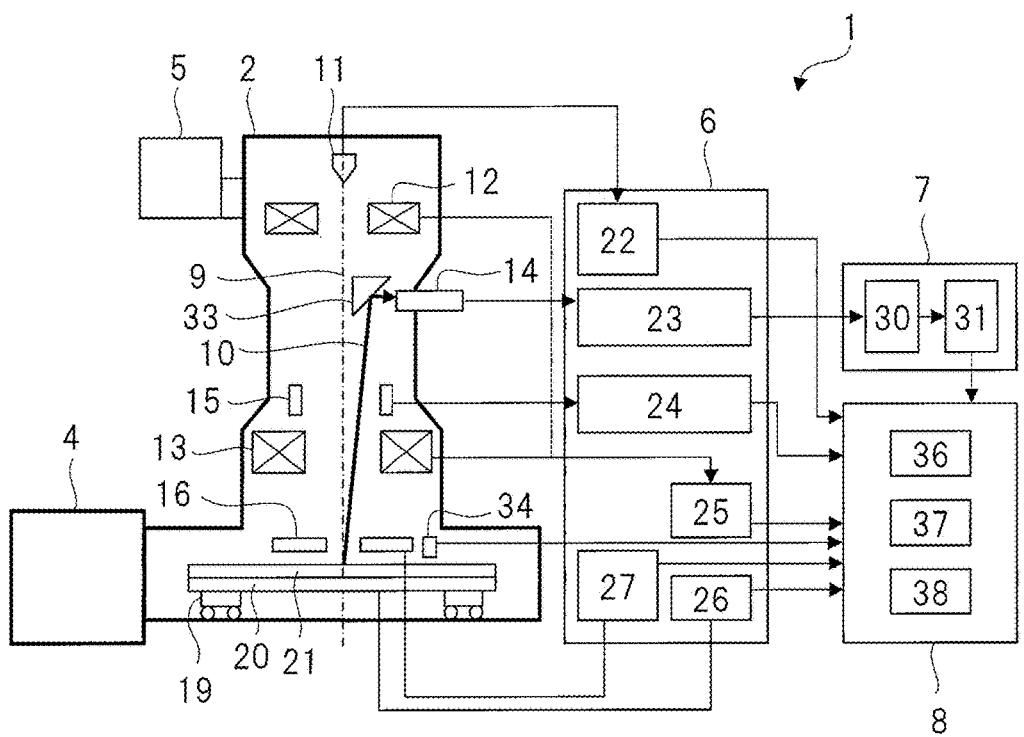
FIG. 1 is a block diagram showing one example of a semiconductor inspection device according to one embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Outline of Embodiment

First, the outline of the embodiment will be described. In the outline of the embodiment, for example, the descriptions will be given while applying corresponding constituent elements, reference characters and the like of the embodiment in parentheses.

(1) A typical semiconductor inspection method of the embodiment is a semiconductor inspection method (FIG. 2), which inspects a semiconductor wafer by using a semiconductor inspection device (semiconductor inspection device 1) that inspects the semiconductor wafer by carrying out an image processing by detecting secondary electrons generated by irradiating the semiconductor wafer (wafer 21) with a charged particle beam. The semiconductor wafer is a single crystal wafer or a wafer with an epitaxial layer formed thereon.

The semiconductor inspection method includes: a first step (S45) of applying a positive potential or a negative potential determined based on a potential of the semiconductor wafer to a counter electrode provided between the semiconductor wafer and an objective lens; a second step (S45) of calculating a secondary electron yield based on the charged particle beam and a current amount of the secondary electrons; a third step (S45) of determining an incident energy that makes the secondary electron yield greater than 1, the negative potential that makes the secondary electron yield smaller than 1 and the positive potential that makes the secondary electron yield greater than 1 at the incident energy; a fourth step (S46) of selecting the incident energy and the negative potential; a fifth step (S46), which is carried out after the fourth step, of scanning an inspection surface of the semiconductor wafer with the charged particle beam to detect the secondary electrons; and a sixth step (S47 to S52) of acquiring a first inspection image obtained in the fifth step and discriminating a macro defect, stacking faults, a basal plane dislocation and a threading dislocation contained in the first inspection image based on a threshold value of a signal amount of the secondary electrons determined in advance.

(2) A typical semiconductor inspection device of the embodiment includes: a charged particle gun (electron gun 11) which generates a charged particle beam; a sample holder (wafer holder 20) which supports a sample (wafer 21); a deflection unit (deflector 15) which scans a sample surface with the charged particle beam; a detector (detector 14) which detects secondary electrons generated by irradiating the sample with the charged particle beam; an image processing unit (image processing unit 30) which processes an output from the detector as an image; a sample potential control unit (retarding voltage control unit 26) which controls a potential of the sample; a counter electrode (counter electrode 16) provided between the sample and an objective lens (objective lens 13); a power supply unit (electrode control unit 27) which applies a positive potential or a negative potential determined based on the potential of the sample to the counter electrode; a yield calculation unit (calculation unit 38) which calculates a secondary electron yield based on the charged particle beam and a current amount of the secondary electrons; a calculation unit (calculation unit 38) which calculates an incident energy that makes the secondary electron yield greater than 1, the negative potential that makes the secondary electron yield smaller than 1 and the positive potential that makes the secondary electron yield greater than 1 at the incident energy based on an output of the yield calculation unit; and a control unit (overall control unit 37) which controls the incident energy and an application of the positive potential or the negative potential to the counter electrode depending on measuring conditions of the sample.

The sample is a single crystal wafer or a wafer with an epitaxial layer formed thereon. The control unit controls the charged particle beam so as to have the incident energy and apply the negative potential to the counter electrode, and scans an inspection surface of the sample with the charged particle beam to detect the secondary electrons. The image processing unit acquires a first inspection image obtained by the control of the control unit, and discriminates a macro defect, stacking faults, a basal plane dislocation and a threading dislocation contained in the first inspection image based on a threshold value of a signal amount of the secondary electrons determined in advance.

(3) A typical manufacturing method of a semiconductor element of the embodiment is a manufacturing method of a semiconductor element using a single crystal wafer or a wafer with an epitaxial layer formed thereon. The manufacturing method of a semiconductor element includes the steps of: setting die regions having a lattice pattern in the wafer; and specifying dies containing the macro defect, the stacking faults and the basal plane dislocation and screening the specified dies by using the semiconductor inspection method according to (1) mentioned above.

Hereinafter, an embodiment based on the above-mentioned outline of the embodiment will be described in detail with reference to drawings. Note that components having the same function are denoted by the same reference characters throughout the drawings for describing the embodiment, and the repetitive description thereof will be omitted.

The present invention can be applied to overall charged particle beam devices as the semiconductor inspection device, but an electron beam device using electrons which are one example of the charged particles will be described in this embodiment for convenience of description. The embodiment can be understood as a charged particle beam device by replacing the electrons with the charged particles in the description of the present specification. Note that ions are conceivable as another example of the charged particles other than the electrons, and the present invention can also be applied to an ion device using ions.

Moreover, in this embodiment, as a single crystal wafer to be inspected, a silicon carbide wafer or a silicon carbide wafer with an epitaxial layer formed thereon is used. Furthermore, as the single crystal wafer, a wafer formed on a silicon wafer can also be used.

In addition, a wafer in which an impurity region is formed in the epitaxial layer or a processed wafer subjected to a surface treatment can also be used.

Then, a secondary electron image of each of the single crystal wafer, epitaxial layer and processed layer is captured, and defects are discriminated based on contrasts thereof. In particular, a macro defect, a basal plane defect and threading dislocation are detected with high accuracy and are then classified.

Namely, in the inspection device using a charged particle beam, a device in which an electrode is provided between a wafer and an objective lens and an image is acquired by applying a positive potential or a negative potential to the electrode is used. The secondary electron yield is measured to determine the energy of charged particles.

First, an image is acquired under negative potential conditions (first inspection image). Bright regions of the first inspection image correspond to macro defects and basal plane defects. Moreover, dark points of the first inspection image correspond to threading dislocations. Next, an image is acquired under positive potential conditions (second inspection image). Dark points of the second inspection image correspond to threading screw dislocations. Dark points that are left after removing the dark points of the second inspection image from the dark points of the first inspection image correspond to threading edge dislocations. It is possible to measure the charged state of the threading dislocations based on the width of a signal profile of the dark points of the first inspection image and the second inspection image and the impurity concentration of the wafer.

First Embodiment

A semiconductor inspection method, a semiconductor inspection device and a manufacturing method of a semiconductor element according to the embodiment will be described with reference to FIGS. 1 to 13. In the following description, a semiconductor inspection device, a semiconductor inspection method using the semiconductor inspection device, a method of detecting a first defect group and a second defect group by the semiconductor inspection method, and a method of analyzing characteristics of defects will be described in sequence. Then, lastly, a manufacturing method of a semiconductor element using these techniques will be described.

<Semiconductor Inspection Device>

First, the semiconductor inspection device according to the embodiment will be described with reference to FIG. 1. FIG. 1 is a block diagram showing one example of the semiconductor inspection device. FIG. 1 shows an inspection device for a single crystal wafer or a single crystal wafer with an epitaxial layer formed thereon to be a basis of the embodiment.

The semiconductor inspection device 1 according to the present embodiment is made up of an optical microscope 34, an electron optical system 2, a wafer transporting system 4, a vacuum exhausting system 5, a control system 6, an image processing system 7 and an operation unit 8.

The electron optical system 2 is provided with an electron gun 11, a condenser lens 12, an objective lens 13, a detector 14, a deflector 15, a counter electrode 16, a reflection plate 33 and others. The electron gun 11 is an electron gun which emits primary electrons 9. The condenser lens 12 is a lens for converging the primary electrons 9. The objective lens 13 is a lens for focusing the primary electrons 9. The detector 14 is a detector for detecting secondary electrons (or reflected electrons) 10. The deflector 15 is a deflector for deflecting the primary electrons 9. The counter electrode 16 is an electrode for controlling an orbit of secondary electrons (or reflected electrons) 10. The reflection plate 33 is a reflection plate for reflecting the secondary electrons (or reflected electrons) 10 toward the detector 14.

The electron optical system 2 is further provided with an XY stage 19, a wafer holder 20 and others. The XY stage 19 is a stage used to move the wafer holder 20 in an XY direction. The wafer holder 20 is a holder for holding a wafer 21 to be inspected.

The wafer transporting system 4 is provided with a transporting mechanism for transporting the wafer 21 to be inspected to the wafer holder 20 of the electron optical system 2 and others. The vacuum exhausting system 5 is provided with an exhausting mechanism for vacuum-exhausting the inside of the electron optical system 2 and others.

The control system 6 is provided with an electron beam control unit 22, a detection system control unit 23, a deflection control unit 24, an electron lens control unit 25, a retarding voltage control unit 26, an electrode control unit 27 and others. The electron beam control unit 22 is a control unit for controlling the electron beam emitted from the electron gun 11. The detection system control unit 23 is a control unit for controlling a detection signal from the detector 14. The deflection control unit 24 is a control unit for controlling the deflector 15. The electron lens control unit 25 is a control unit for controlling the condenser lens 12 and the objective lens 13. The retarding voltage control unit 26 is a control unit for controlling a retarding voltage to be applied to the wafer 21 held on the wafer holder 20. The electrode control unit 27 is a control unit for controlling the counter electrode 16.

The image processing system 7 is provided with an image processing unit 30, an image storage unit 31 and others. The image processing unit 30 is a processing unit for carrying out an image-signal processing after converting the detection signal from the detection system control unit 23 into a digital image signal, thereby detecting a defect. The image storage unit 31 is a storage unit for storing defect information or the like determined in the image processing unit 30.

Figure 3:
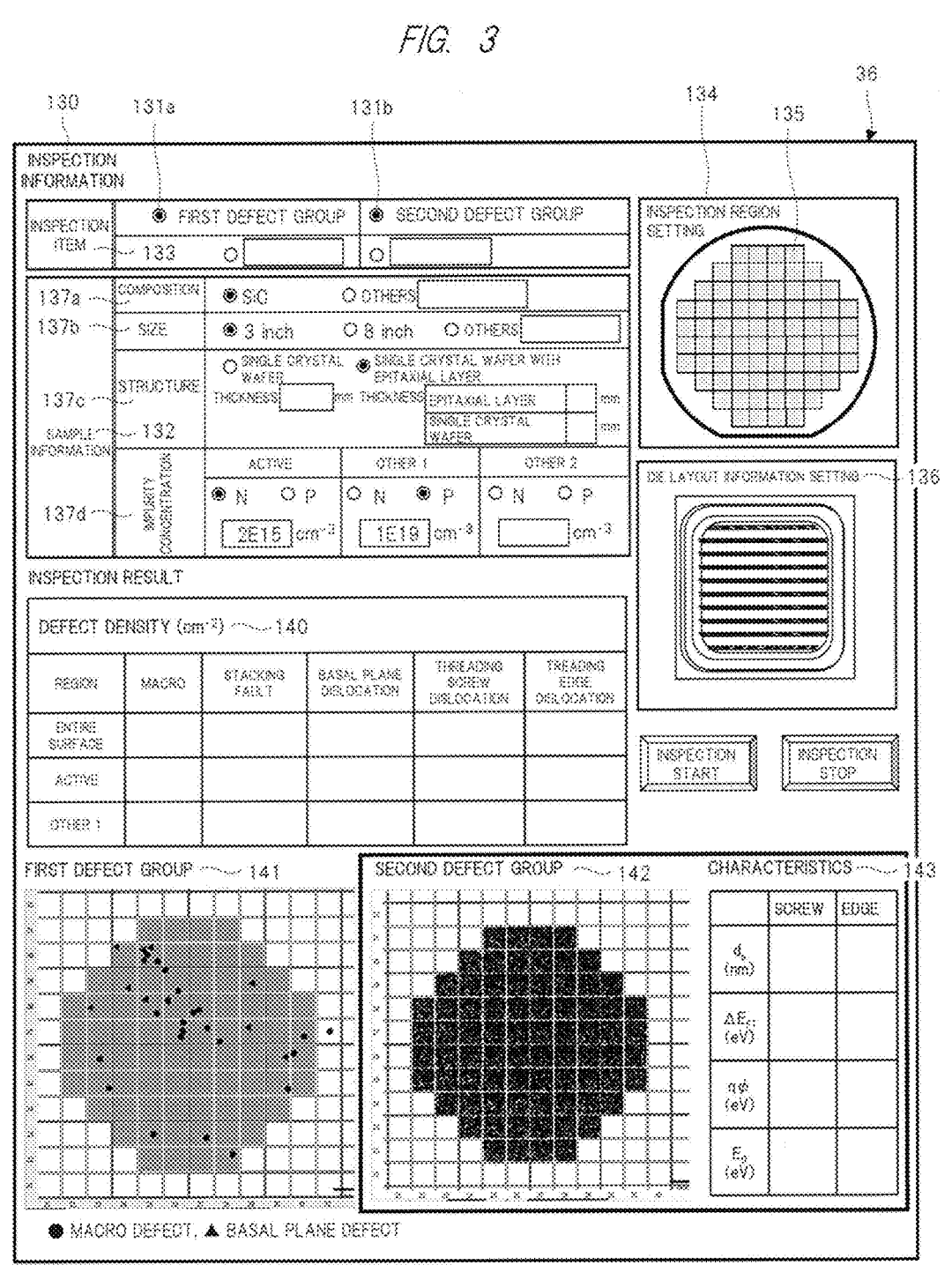

The operation unit 8 is provided with a GUI (graphical user interface: FIG. 3) 36 for carrying out input/output operations, an overall control unit 37 for carrying out the control for input/output operations and the control for the entire semiconductor inspection device, a calculation unit 38 for calculating a secondary electron yield and an incident energy and further a negative potential and a positive potential at the incident energy and others.

The GUI 36 is provided with an input unit for dividing the wafer 21 into dies and specifying die numbers, an input unit for inputting mask information, an input unit for inputting an impurity concentration of the wafer 21 and others. Moreover, the GUI 36 is further provided with an output unit for classifying defects into a first defect group and a second defect group from the inspection of the wafer 21 and outputting the result, an output unit for outputting the coordinates and size of the first defect group, an output unit for extracting dies in which the coordinates of the first defect group are contained, an output unit for outputting a defect density of the second defect group, an output unit for outputting electric characteristics of the second defect group, an output unit for extracting dies to be screened and others.

The calculation unit 38 is a calculation unit that calculates a secondary electron yield based on current amounts of the primary electrons 9 and the secondary electrons 10, and further calculates an incident energy that makes the secondary election yield greater than 1 based on the secondary electron yield, a negative potential that makes the secondary electron yield smaller than 1 and a positive potential that makes the secondary electron yield greater than 1 at this incident energy.

The inside of the electron optical system 2 is vacuum-exhausted to $10^{-7}$ to $10^{-4}$ Pa by the vacuum exhausting system 5. The condenser lens 12 and the objective lens 13 are controlled by the electron lens control unit 25 from the operation unit 8. The deflector 15 is controlled by the deflector control unit 24 from the operation unit 8. The counter electrode 16 is controlled by the electrode control unit 27 from the operation unit 8.

After the primary electrons 9 of the electron beam emitted from the electron gun 11 have been converged by the condenser lens 12 by using the electron beam control unit 22, the resulting electrons are deflected by the deflector 15 and reach the surface of the wafer 21 to be inspected by the objective lens 13. For secondary electrons (or reflected electrons) 10 caused by the primary electrons 9 and emitted from the surface of the wafer 21, positive voltage (VP) or negative voltage (VN) is set by the counter electrode 16, thereby controlling the orbit thereof.

The wafer 21 to be inspected is fixed onto the wafer holder 20. Moreover, the wafer holder 20 can be moved in the XY direction by the XY stage 19. Furthermore, a retarding voltage (Vr) is applied to the wafer 21 to be inspected by the retarding voltage control unit 26.

The secondary electrons (or reflected electrons) 10 are reflected by the reflection plate 33, and are input to the detector 14. The detector 14 detects the input secondary electrons (or reflected electrons) 10 and outputs a detection signal thereof to the detection system control unit 23. The detection system control unit 23 transmits the detection signal detected by the detector 14 to the image processing unit 30. In the image processing unit 30, an AD conversion for converting the detection signal detected by the detector 14 into a digital image signal is carried out, and thereafter, a defect determination for determining a defect by carrying out an image signal processing is performed. This determined defect information (kinds of defects, sizes and coordinates) is stored in the image storage unit 31.

<Semiconductor Inspection Method>

Figure 2:
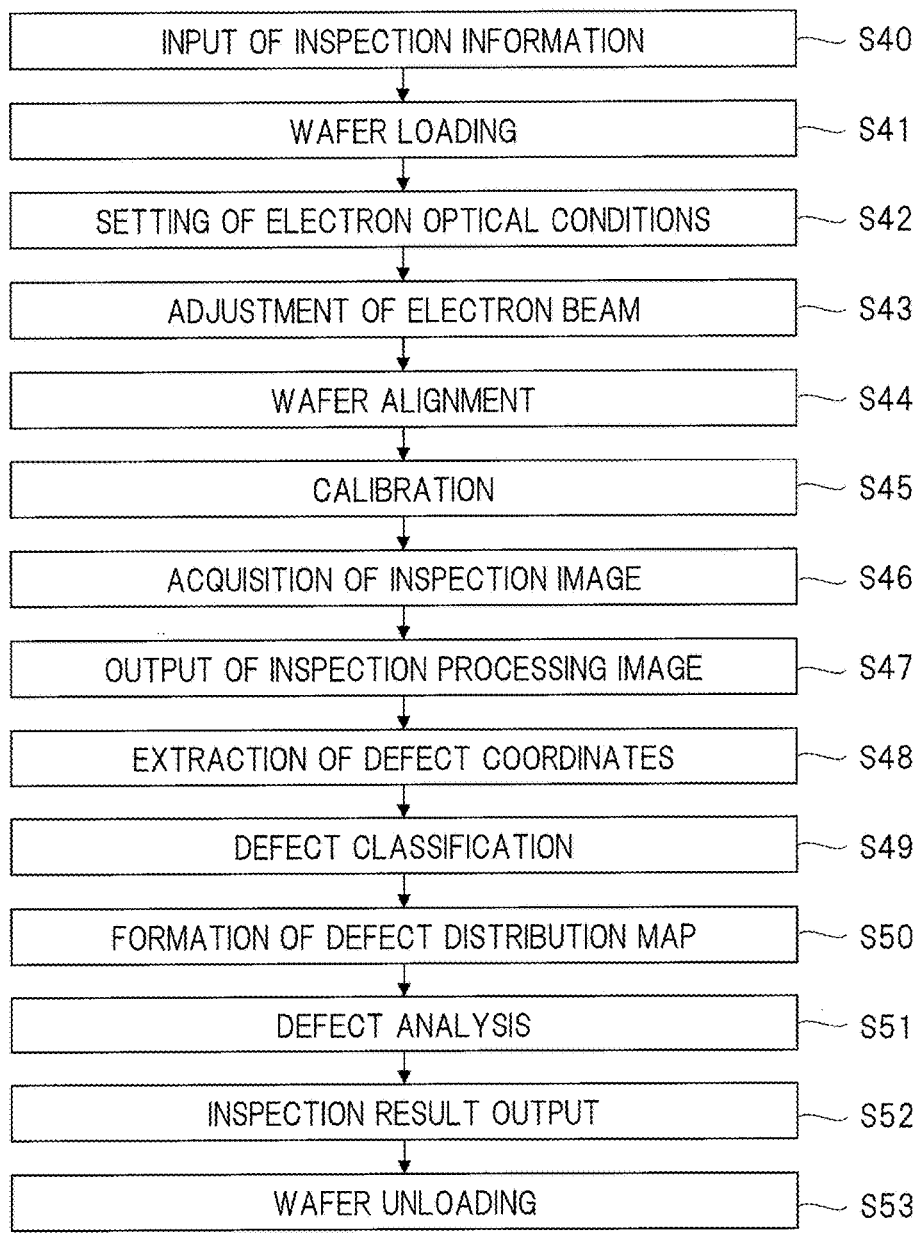
FIG. 2 is a view showing one example of an inspection flow of a semiconductor inspection method by the semiconductor inspection device of FIG. 1.
Figure 4:
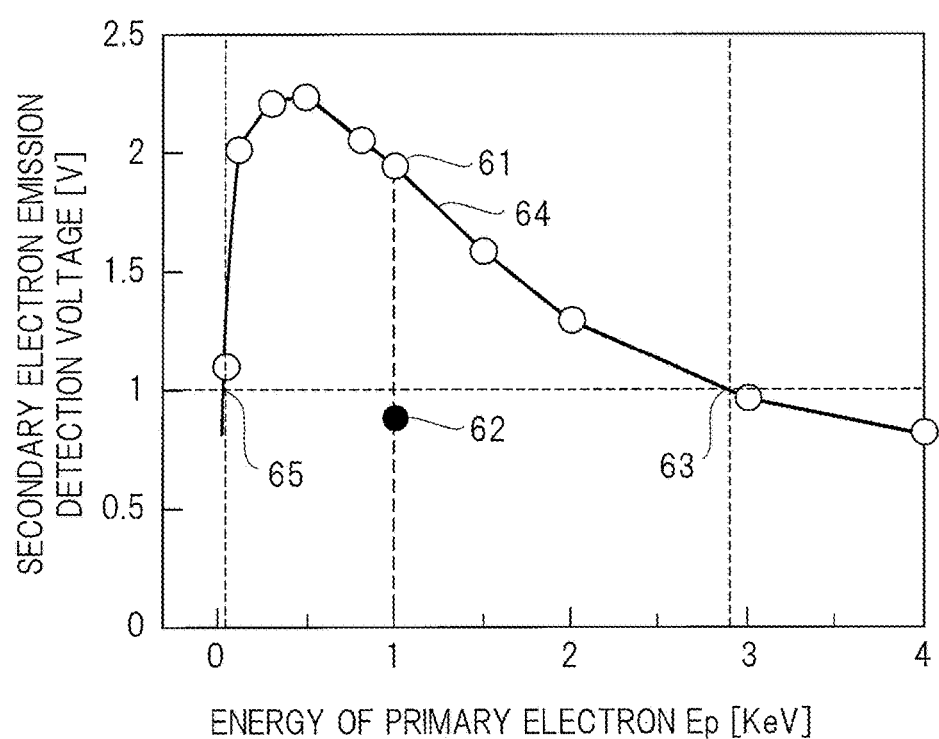
FIG. 4 is an explanatory view showing one example for determining electron optical conditions in the semiconductor inspection method of FIG. 2.

Next, a semiconductor inspection method by the above-mentioned semiconductor inspection device 1 will be described by using FIG. 2 with reference to FIG. 3 and FIG. 4. More specifically, an inspection flow of a single crystal wafer or a single crystal wafer with an epitaxial layer formed thereon by the semiconductor inspection device 1 shown in FIG. 1 will be described. FIG. 2 is a view showing one example of the inspection flow of the semiconductor inspection method by the use of the semiconductor inspection device. FIG. 3 is a view showing one example of a GUI in the semiconductor inspection device. FIG. 4 is an explanatory view showing one example for determining electron optical conditions (Ep, VP and VN) in the semiconductor inspection method.

First, in an input process (S40) of inspection information, inspection information is input to the operation unit 8. This input of inspection information is carried out by the GUI (graphical user interface) 36 shown in FIG. 3. Inspection information 130 is displayed as a list using pull-down and check boxes (first defect group inspection item input column 131*a*, second defect group inspection item input column 131*b*) and others or can be directly input manually.

An inspection item input column 133 is used for inputting kinds of defects to be inspected, for example, surface bump (concave) defect, surface pit (convex) defect, step bunching, carrot defects, comet defects, triangular defects, basal plane dislocation, stacking faults, threading screw dislocation, threading edge dislocation and others. Further, the user can arbitrarily add a defect item thereto. Moreover, macro defects (surface bump (concave) defect, surface pit (convex) defect, step bunching, carrot defects, comet defects and triangular defects) and basal plane defects (basal plane dislocation and stacking faults) can be defined as a first defect group to be selected. Furthermore, threading dislocations (threading screw dislocation and threading edge dislocation) can be defined as a second defect group to be selected.

Next, to a sample information input column 132, composition 137a, wafer size 137b, structure 137c, impurity concentration 137d of a wafer specific region and the like of the wafer 21 to be inspected are input. In the example shown in FIG. 3, SiC (silicon carbide) and others are shown as the composition 137a of the wafer 21. As the wafer size 137b, 3 inches, 8 inches and others are shown. As the structure 137c, a single crystal wafer and a single crystal wafer with an epitaxial layer are shown. In the case of the single crystal wafer, the thickness thereof is input, and in the case of the single crystal wafer with an epitaxial layer, the respective thicknesses of the epitaxial layer and the single crystal wafer are input. As the impurity concentration 137d of a wafer specific region, the n-type or p-type of the conductivity type and the value of the impurity concentration are input for each of regions including an active region and other regions 1 and 2.

Next, to an inspection region setting column 134, inputs for setting inspection regions are carried out. The inspection region may be the entire wafer surface. Moreover, it is also possible to select the regions to be inspected based on divided dies 135 on the GUI. Die numbers are specified for the selection. Furthermore, it is also possible to select a layout based on mask information of an element fabrication process by inputting the layout to a die layout information setting column 136. In addition, it is also possible to directly input the coordinates.

After the completion of the input of the inspection information 130 as described above, by specifying (clicking) an inspection start button provided in the GUI 36 of FIG. 3, the inspection is automatically started in accordance with the control by the overall control unit 37 and the control system 6. Moreover, when the inspection needs to be stopped, the inspection can be stopped by specifying an inspection stop button.

Next, a wafer 21 to be inspected is set to a wafer cassette of the wafer transport system 4 in the semiconductor inspection device 1. A sheet or a plurality of sheets of inspection wafers can be set to the wafer cassette. Note that this operation may be carried out before or after the input (S40) of the inspection information 130.

Next, in a wafer load process (S41), the wafer 21 is loaded to the wafer holder 20 on the XY stage 19 of the semiconductor inspection device 1.

Next, in an electron optical condition setting process (S42), electron optical conditions of the electron optical system 2 are set. The electron optical conditions include Ep, VP, VN and the like to be described below. Moreover, these conditions are automatically determined based on the aforementioned inspection information 130. Furthermore, these may be input manually.

Next, in an electron beam adjustment process (S43), an electron beam to be emitted from the electron gun 11 is adjusted. The adjustment of the electron beam includes the adjustments of the optical axis, focus and astigmatism and the like. The adjustment of the electron beam can be automatically carried out.

Next, in a wafer alignment process (S44), the wafer 21 to be inspected is aligned. The alignment corresponds to the alignment between coordinates (Xsub, Ysub) of the wafer 21 to be inspected and coordinates (Xs, Ys) of the XY stage 19.

Next, in a calibration process (S45), a calibration is carried out. First, a method of determining an incident energy Ep will be described with reference to FIG. 4. For example, the electric current of primary electrons 9 is 100 pA, the voltage Vp is −10 kV, the retarding voltage Vr is −9.7V, and a silicon dioxide film having a film thickness of 1 micron formed on a silicon wafer by a thermal oxidation method is used as a calibration sample. The calibration sample is disposed on a part of the XY stage 19. For example, it is disposed on a corner part of the XY stage 19. Then, primary electrons 9 are first applied to the calibration sample. At this time, since the silicon dioxide film is positively charged, an electric current of secondary electrons 10 equivalent to the current amount of the primary electrons 9 is emitted. In this case, the secondary electrons 10 are a sum of so-called "true secondary electrons" and reflected electrons. At this time, by adjusting the gain and offset of a preamplifier connected to the detector 14 for detecting the secondary electrons 10, an output voltage is set to be, for example, 1 V.

Next, after confirming that an output voltage becomes 2 V at the time when the electric current of the primary electrons 9 is set to 200 pA and then confirming that an output voltage becomes 0.5 V at the time when the electric current of the primary electrons 9 is set to 50 pA, the linearity of the detector 14 is confirmed. In the case when no linearity is obtained, the gain is adjusted so as to have an output voltage by which the linearity of the amplifier can be obtained. In the above-mentioned manner, conversion of the current amount of the secondary electrons 10 can be made from the output voltage of the amplifier. The above-mentioned calibration (S45) can be carried out automatically or carried out by forming a recipe by the user himself or herself.

Next, the wafer 21 to be inspected (in this case, silicon carbide single crystal wafer) is irradiated with the primary electrons 9. Under the conditions that the electric current of the primary electrons 9 is set to 100 pA and Vp is set to −10 kV, the electric current of the secondary electrons 10 is measured while changing Vr from −9.9 kV to 0 V. The measurement is carried out automatically or manually. The secondary electron yield (referred to also as the entire electron yield) is given by the secondary electron current/primary electron current. The energy of the primary electrons 9 is given by (Vr−Vp) electron volt (eV).

FIG. 4 shows one example of a secondary electron yield curve 64 in which the dependency of the secondary electron yield on the incident energy (energy Ep of primary electrons 9) is plotted. In FIG. 4, the energy Ep of the primary electrons 9 is plotted on the axis of abscissas and the detection voltage of the secondary electron emission is plotted on the axis of ordinates. An energy 65 of the primary electrons 9 at which the secondary electron yield is set to 1 is defined as a reference energy E1, and a reference character 63 denotes a reference energy E2. In relation to the output signal voltage from the detector 14, the reference signal voltage is set to 1 V. Ep is an energy that is higher than the reference energy E1 and is lower than the reference energy E2, and Ep is set to 1 kV. The secondary electron emission detection voltage 61 is 1.8 V.

Next, the electric potential VP of the counter electrode 16 is set to 2 kV so as to use it as an electric potential for drawing the secondary electrons 10 toward the detector 14, and the electric potential VN of the counter electrode 16 is a voltage for making the secondary electron emission detection voltage smaller than 1 V and is set to (Vr−50 V) so as to form the electric potential that makes the secondary electrons 10 return to the surface side of the wafer 21. By applying the VN, the secondary electron emission detection voltage 62 is set to 0.9 V. Namely, 61 denotes the secondary electron emission detection voltage under the VP condition and 62 denotes the secondary electron emission detection voltage under the VN condition.

Next, in an inspection image acquiring process (S46), an inspection image is acquired. As the inspection image, an image is acquired in the image processing unit 30 by moving the XY stage 19 based on the inspection information 130, deflecting the primary electrons 9 in the XY direction by the deflector 15 and acquiring the signal of the secondary electrons 10 by the detector 14 in synchronization with the deflection of the primary electrons 9. The movement of the XY stage 19 and the deflection of the primary electrons 9 may be carried out independently or may be carried out in cooperation with each other. Moreover, as will be described later with reference to FIG. 5, by setting a stage moving direction 75 to be perpendicular to an electron beam scanning direction 74 of the primary electrons 9, the signal of the secondary electrons 10 may be obtained while synchronizing the deflection of the primary electrons 9 and the movement of the XY state 19. In this case, a reference point is preliminarily set on the wafer 21 to be inspected so that the stage coordinates (Xs, Ys) and the primary electron scanning coordinates (Xe, Ye) are made coincident with each other. The wafer coordinates (Xsub, Ysub) are given by (Xs+Xe, Ys+Ye).

Next, in an inspection processing image output process (S47), based on the aforementioned reference signal voltage relating to the output signal voltage from the detector 14, an inspection processing image that has been subjected to an image processing by a threshold value filter is output.

Next, in a defect coordinate extraction process (S48), based on the inspection information 130, inspection images and inspection processing images under the different electron optical conditions are acquired, and a figure corresponding to a defect is acquired and defect coordinates such as apex coordinates, center of gravity coordinates and the like are extracted.

Next, in a defect classifying process (S49), defects are classified based on pattern recognition of defect figures.

Next, in a defect distribution map forming process (S50), a defect distribution map for each of defects is automatically formed.

Next, in a defect analyzing process (S51), analyzing processes for the density of the defects and electric characteristics are carried out based on the value of inputs (S40) of the inspection information 130 and the inspection images.

The above-mentioned processes of the inspection processing image output, defect coordinate extraction, defect classification, defect map formation and defect analysis can be carried out by a computer of the semiconductor inspection device 1 of the present embodiment. Moreover, these may be carried out by using a computer connected through a network. Furthermore, by connecting a plurality of inspection devices with one another through a network, a plurality of inspection wafers can be inspected in parallel with one another.

Next, in an inspection result output process (S52), the inspection results are output to the operation unit 8. The outputs of the inspection results are carried out by the GUI 36 shown in FIG. 3. As the inspection results, a defect density result output 140, a defect distribution output 141 of first defect group, a defect distribution output 142 of second defect group, a defect electric characteristic output 143 of second defect group and the like are displayed. As the defect density result output 140, the defect densities of each of the macro defect, stacking faults, basal plane dislocation, threading screw dislocation and threading edge dislocation are displayed for each region of the entire surface, active and other 1. As the defect electric characteristic output 143 of second defect group, the characteristic values of each of the threading screw dislocation and threading edge dislocation are displayed. These inspection results will be described later in detail.

Next, in a wafer unload process (S53), the inspection wafer is unloaded. Then, when there is another inspection wafer, the wafer is loaded and subjected to the above-mentioned inspection. The above-mentioned process is repeated until all the inspection wafers have been finished.

<Method of Detecting First Defect Group>

Next, a method of detecting the first defect group by using the above-mentioned semiconductor inspection device 1 and semiconductor inspection method will be described with reference to FIG. 5, FIG. 6A, FIG. 6B, FIG. 6D, FIG. 7A and FIG. 7B. More specifically, a method of detecting the first defect group (macro defect, basal plane dislocation and stacking faults) of the single crystal wafer to be inspected by the use of the semiconductor inspection device 1 shown in FIG. 1 based on the semiconductor inspection method shown in FIG. 2 will be described.

Figure 5:
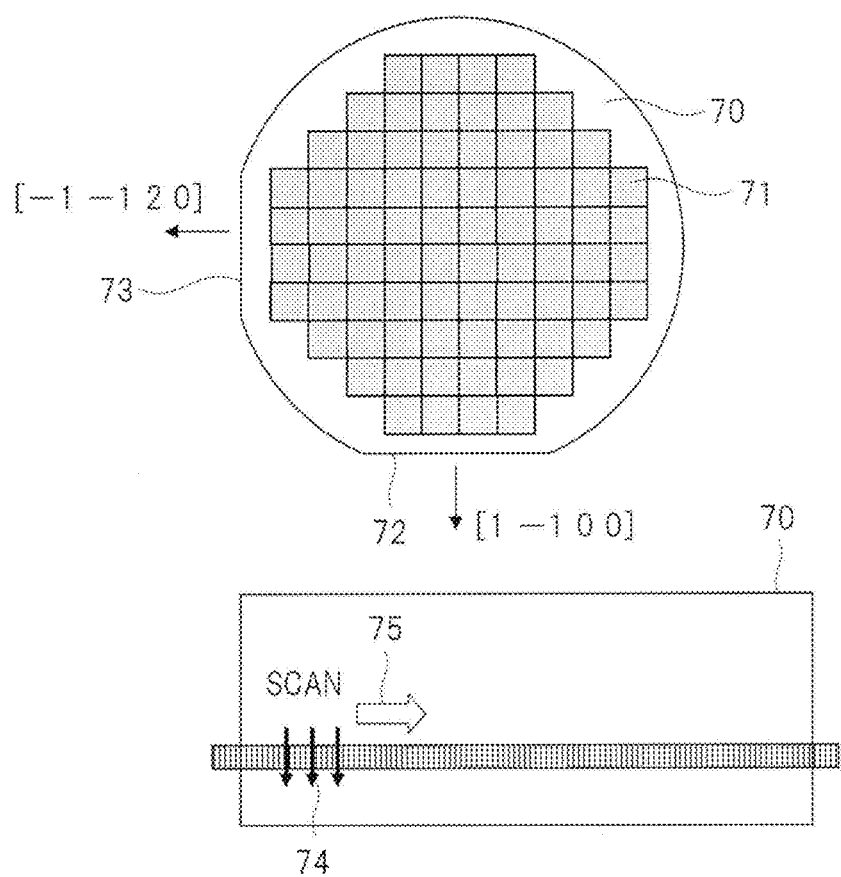
FIG. 5 is an explanatory view showing one example of a wafer inspection method in the semiconductor inspection method of FIG. 2.

FIG. 5 is an explanatory view showing one example of a wafer inspection method. In FIG. 5, the conductivity type of an inspection wafer 70 to be inspected is an n-type. The impurity concentration of the inspection wafer 70 is $2 \times 10^{15}$ cm$^{-3}$. A first orientation flat 72 of the inspection wafer 70 corresponds to [1 –1 0 0] direction, and a second orientation flat 73 corresponds to [–1 –1 2 0] direction. The inspection region of the inspection wafer 70 is divided into dies 71 with a lattice pattern. Each of the dies 71 preferably forms a formation region of one semiconductor element. The first orientation flat 72 is aligned to the X direction of the XY stage 19 and the second orientation flat 73 is aligned to the Y direction of the XY stage 19, so that the inspection wafer 70 is fixed to the XY stage 19.

In order to set the energy Ep of the primary electrons 9 to 1 keV, Vp is set to –10 kV and Vr is set to –9 kV. The electric potential VN of the counter electrode 16 is set to –9.05 kV and the electric current of the primary electrons 9 is set to 100 pA. The primary electrons 9 scan the surface of the inspection wafer 70 in the X direction and the Y direction by the deflector 15. In synchronization with the scanning of the primary electrons 9, a signal of the secondary electrons 10 is acquired. Moreover, by performing the scanning of the primary electrons 9 in the Y direction (electron beam scanning direction 74) and moving the XY stage 19 in the X direction (stage moving direction 75) as shown in FIG. 5, an image may be acquired in synchronization with the scanning of the primary electrons 9 and the movement of the XY stage 19. Furthermore, it is also possible to perform the scanning of the primary electrons 9 in the X direction and move the XY stage 19 in the Y direction.

A reference point is preliminarily set on the inspection wafer 70, and the stage coordinates (Xs, Ys) and the primary electron scanning coordinates (Xe, Ye) are made coincident with each other. The wafer coordinates (Xsub, Ysub) are given by (Xs+Xe, Ys+Ye). When the first orientation flat 72 and the second orientation flat 73 have been machined on the inspection wafer 70, the X direction of the XY stage 19 is aligned to the direction of the first orientation flat 72, and the Y direction of the XY stage 19 is aligned to the direction of the second orientation flat 73. In the inspection region setting column 134 of the GUI 36 shown in FIG. 3, a die 135 corresponding to the element is set.

Figure 6A:
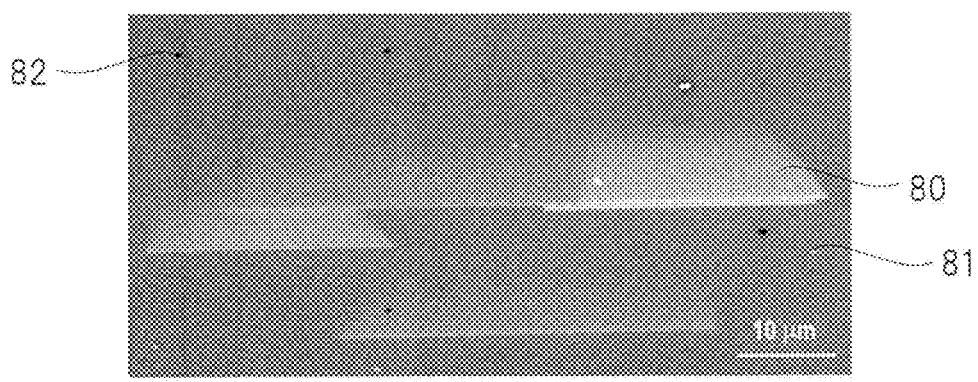
FIG. 6A is an explanatory view showing one example of an image by which defects are inspected in the semiconductor inspection method of FIG. 2.
Figure 6B:
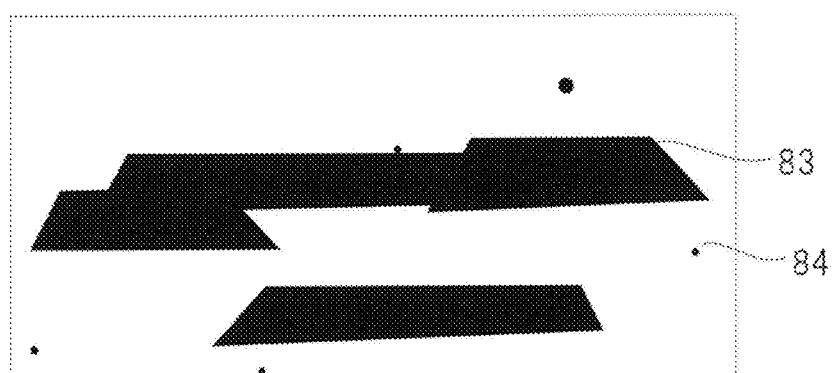
FIG. 6B is an explanatory view showing one example of an image processing by which defects of a first defect group are inspected in the semiconductor inspection method of FIG. 2.

FIG. 6A is an explanatory view showing one example of an image by which defects are inspected. FIG. 6B is an explanatory view showing one example of an image processing by which defects of a first defect group are inspected. FIG. 6D is an explanatory view showing another example of an image by which defects of the first defect group are inspected.

FIG. 6A is one of inspection images by which wafer defects are inspected. Defects (threading dislocation 82, stacking faults 80 and basal plane dislocation 81) that cannot be inspected by the optical microscope 34 are contained in the image. FIG. 6D shows an inspection image at another place on the wafer, and a reference character 86 denotes an optical microscopic image observed by using the optical microscope 34 of the present inspection device. First inspection images corresponding to the optical microscopic image 86 of detected macro defects 87 and 88 having the size of several hundreds of microns are denoted as 91a and 91b. Namely, the defect portion (end portion 87 of the macro defect) of the optical microscopic image 86 corresponds to the defect portion (apex portion 90 of the macro defect) of the first inspection image 91a, and the defect portion (macro defect 88) of the optical microscopic image 86 similarly corresponds to the defect portion (bottom portion 89 of the macro defect) of the first inspection image 91b. The macro defect can be inspected by using only the optical microscope 34 of the present inspection device.

Next, an image processing is carried out. A reference signal voltage is set to 1V in relation to the output inspection signal voltage from the detector 14. FIG. 6B shows a first A image obtained by carrying out a threshold-value filtering process on a signal having an output inspection signal voltage of 1.5 V or more with respect to the inspection image of FIG. 6A. In the same manner, with respect to the inspection images 91a and 91b of FIG. 6D, the first A image can be obtained by carrying out the threshold-value filtering process on a signal having 1.5 V or more. By extracting a dot-shaped figure 84 and a polygonal figure 83 of the first A image shown in FIG. 6B, the distribution of the first defect group can be obtained. The dot-shaped figure 84 indicates a basal plane dislocation 81, and the polygonal figure 83 indicates a stacking fault 80. In particular, figures having 100 microns or more can be extracted as macro defects.

Figure 7A:
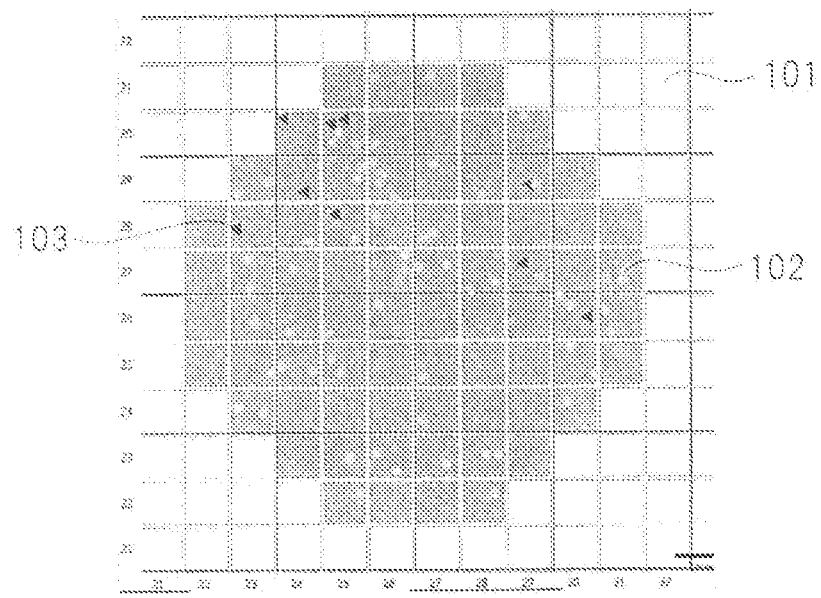
FIG. 7A is an explanatory view showing one example of a defect distribution of the first defect group in the semiconductor inspection method of FIG. 2.
Figure 7B:
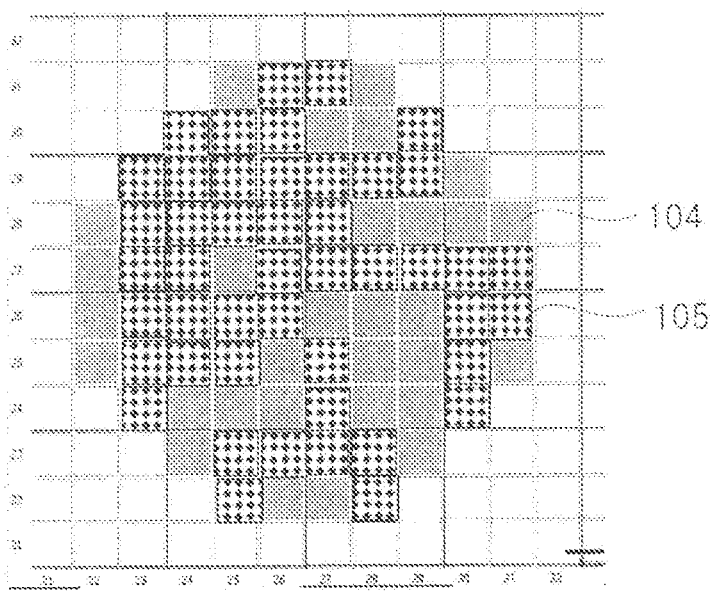
FIG. 7B is an explanatory view showing one example of a discrimination distribution of the first defect group in the semiconductor inspection method of FIG. 2.

FIG. 7A is an explanatory view showing one example of the defect distribution of the first defect group. FIG. 7B is an explanatory view showing one example of a discrimination distribution of the first defect group.

FIG. 7A shows an output of defect distribution 101 of the first defect group including basal plane defects 103 (Δ marks) and macro defects 102 (O marks). FIG. 7B shows an output of distribution in which dies 104 containing no defects in the first defect group and dies 105 containing defects in the first defect group are discriminated from each other. When the dies are set to 6 mm×6 mm, the total number of dies is 76, and 30 pieces of these dies are discriminated as good dies, so that the non-defective rate is 39.4%. When the dies are set to 3 mm×3 mm, the total number of dies is 304, and the good dies are 238 pieces, so that the non-defective rate is 78.2%. Namely, in the semiconductor element for use in power control, when a rated current becomes greater, the die size needs to be larger. By the inspection of the present embodiment, wafer quality in accordance with the rated value of the semiconductor element can be determined.

<Method of Detecting Second Defect Group>

Next, a method of detecting the second defect group by the use of the above-mentioned semiconductor inspection device 1 and semiconductor inspection method will be described with reference to FIG. 6C and FIG. 8. More specifically, the method of detecting the second defect group by using the inspection image shown in FIG. 6A will be described. The second defect group includes threading screw dislocations and threading edge dislocations. A single threading dislocation does not cause a fatal defect, but a fatal defect might be caused when aggregated. For this reason, the defect density of dies is evaluated in the inspection.

Figure 6C:
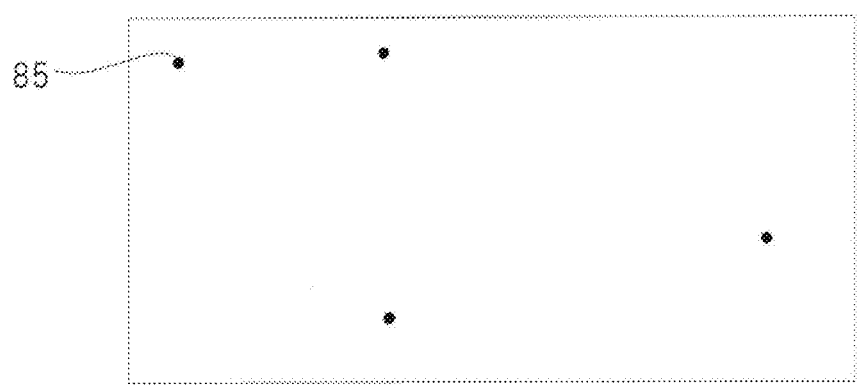
FIG. 6C is an explanatory view showing one example of an image processing by which defects of a second defect group are inspected in the semiconductor inspection method of FIG. 2.
Figure 6D:
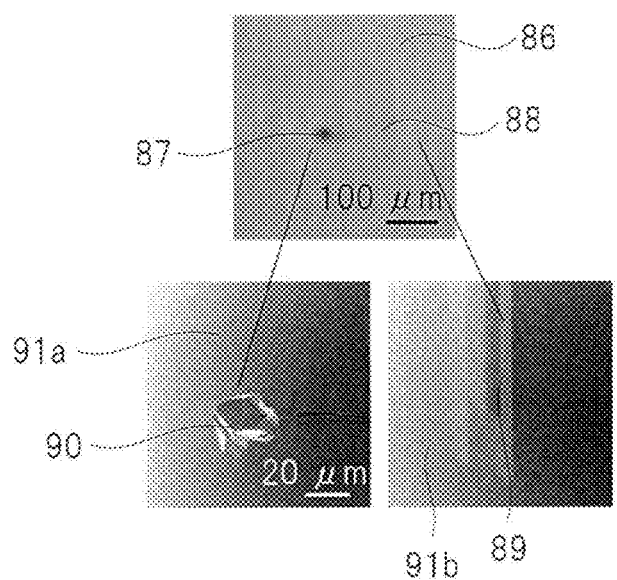
FIG. 6D is an explanatory view showing another example of an image by which defects of the first defect group are inspected in the semiconductor inspection method of FIG. 2.

FIG. 6C is an explanatory view showing one example of an image processing by which defects of the second defect group are inspected. FIG. 8 is an explanatory view showing one example of a defect distribution of the second defect group.

With respect to the first inspection image (threading dislocation 82) of FIG. 6A mentioned above, FIG. 6C shows a first B image obtained by carrying out a threshold-value filtering process on a signal having an output inspection signal voltage of 0.5 V or less. In FIG. 6C, each of dot-shaped figure 85 indicates a threading dislocation. FIG. 8 shows a wafer in-plane distribution of threading dislocations, that is, a defect distribution 110 of the second defect group. In FIG. 8, enlargement of the dies denoted as a reference character 111 corresponds to an enlarged view denoted as a reference character 112 (enlarged view of a defect distribution of dies). By these image processing and defect distribution, the density of threading dislocations 113 of $1.9 \times 10^3$ cm$^{-2}$ can be obtained.

<Method of Discriminating Threading Screw Dislocation and Threading Edge Dislocation in Defect Characteristic Analysis of Second Defect Group>

Next, a method of discriminating threading screw dislocations and threading edge dislocations in a defect characteristic analysis of the second defect group by the use of the aforementioned semiconductor inspection device 1 and semiconductor inspection method will be described with reference to FIG. 9A.

Figure 9A:
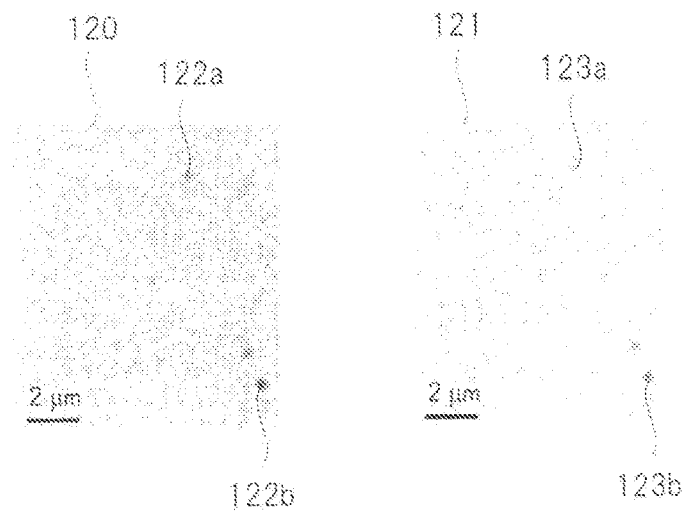
FIG. 9A is an explanatory view showing one example in which a threading screw dislocation and a threading edge dislocation are discriminated in a defect characteristic analysis of the second defect group in the semiconductor inspection method of FIG. 2.

FIG. 9A is an explanatory view showing one example in which a threading screw dislocation and a threading edge dislocation are discriminated in a defect characteristic analysis of the second defect group. In FIG. 9A, a reference character 120 denotes a first inspection image at a place different from that of FIG. 6A acquired under the inspection conditions of FIG. 5. Meanwhile, a second inspection image under the conditions in which the electric potential of the counter electrode 16 is changed to positive and VP is set to 2 kV is acquired. A reference character 121 denotes the second inspection image (obtained at the same place as the first inspection image) thus acquired.

The first inspection image 120 and the second inspection image 121 obtained at the same place are compared with each other. Contrast 122b indicating a threading screw dislocation of the first inspection image 120 and contrast 123b indicating a threading screw dislocation of the second inspection image 121 are equivalent contrasts. In this case, the presence of the threading screw dislocation can be confirmed by an etching method using potassium hydroxide. Moreover, contrast 122a indicating the threading edge dislocation of the first inspection image 120 is greatly different from contrast 123a indicating the threading edge dislocation of the second inspection image 121. In this case, the presence of the threading edge dislocation can be confirmed by an etching method using potassium hydroxide. Namely, by comparing the first inspection image 120 and the second inspection image 121 with each other, the threading screw dislocation and the threading edge dislocation can be discriminated.

Figure 8:
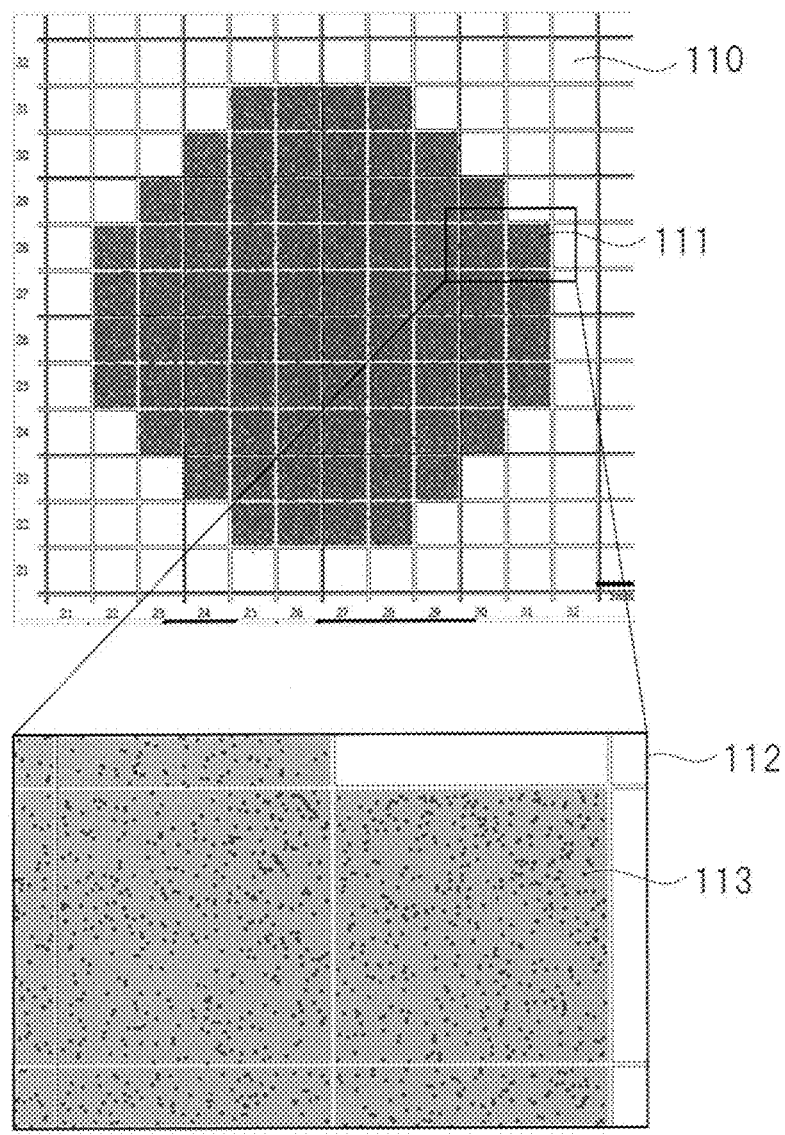
FIG. 8 is an explanatory view showing one example of a defect distribution of the second defect group in the semiconductor inspection method of FIG. 2.

Also in the first inspection image 120 and the second inspection image 121, like the case of FIG. 8 mentioned above, the distribution of the threading screw dislocations and the threading edge dislocations can be obtained by the images obtained by carrying out a threshold-value filtering process on a signal having an output inspection signal voltage of 0.5 V or less.

From the descriptions above, it can be understood that bright regions of the first inspection image correspond to macro defects and basal plane defects and dark points correspond to threading dislocations. Moreover, it can also be understood that dark points in the second inspection image correspond to threading screw dislocations. Furthermore, it can also be understood that dark points left after removing the dark points of the second inspection image from the dark points of the first inspection image correspond to threading edge dislocations.

<Method of Acquiring Charge Characteristics of Threading Dislocation>

Next, a method of acquiring charge characteristics of the threading dislocation by the use of the above-mentioned first inspection image 120 and second inspection image 121 of FIG. 9A will be described with reference to FIG. 9B, FIG. 10A and FIG. 10B.

Figure 9B:
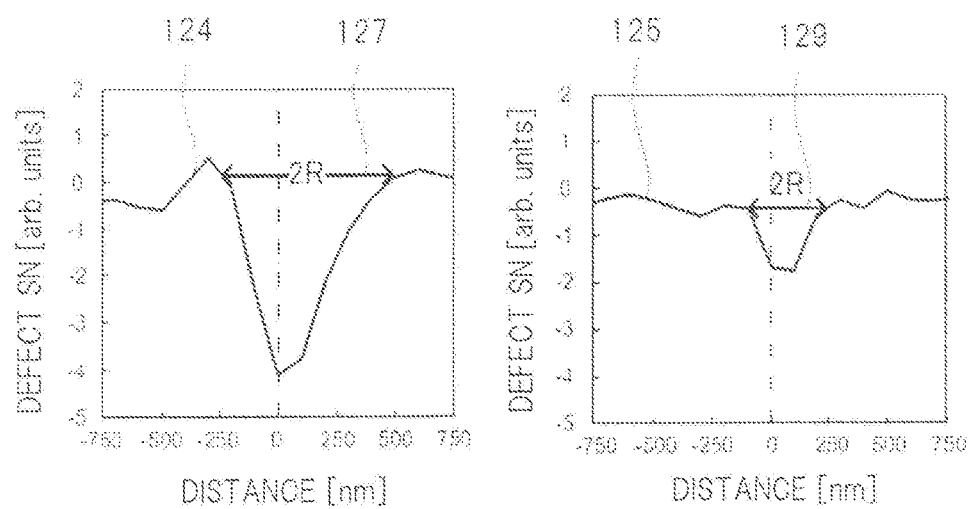
FIG. 9B is an explanatory view showing one example of a profile of contrast of a threading dislocation in the semiconductor inspection method of FIG. 2.

FIG. 9B is an explanatory view showing one example of a profile of contrast of a threading dislocation. FIG. 10A is an explanatory view showing one example in which a threading dislocation is formed in an n-type semiconductor in which donor ions and electrons are present. FIG. 10B is an explanatory view showing one example of an energy band of FIG. 10A.

In FIG. 9B, a reference character 124 denotes a profile of a contrast of the threading dislocation of the first inspection image 120, and 125 denotes a profile of a contrast of the threading dislocation of the second inspection image 121. A width 127 or 129 (width of profile) corresponding to a dark dot-shaped contrast is a width of a depletion region.

Figure 10A:
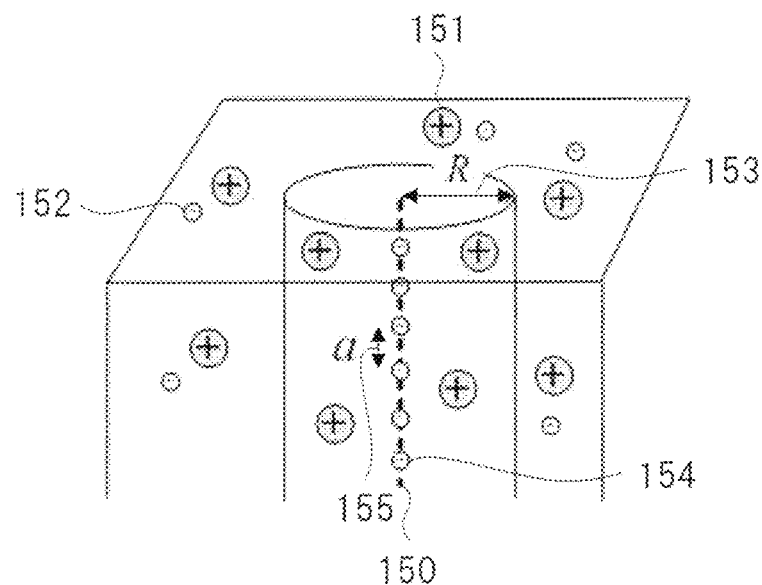
FIG. 10A is an explanatory view showing one example in which a threading dislocation is formed in an n-type semiconductor in which donor ions and electrons are present in the semiconductor inspection method of FIG. 2.
Figure 10B:
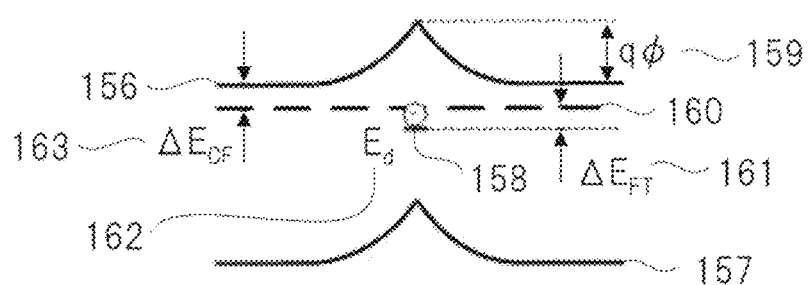
FIG. 10B is an explanatory view showing one example of an energy band of FIG. 10A.

FIG. 10A is a schematic view showing a case where a threading dislocation 150 is formed in an n-type semiconductor in which donor ions 151 and conduction electrons 152 are present, and FIG. 10B shows an energy band thereof. A defect level 162 of the dislocation is formed at a position deeper than a Fermi level 160, and when an electron 158 is captured by the defect level 162, the Coulomb energy increases and a depleted portion is formed near the dislocation line. In this case, as shown in FIG. 10A, electrons are captured at equal intervals of an average interval (a) 155 of electrons 154 captured by the dislocation, and a depletion region having a cylindrical shape with a depletion radius (R) 153 is formed. The depletion radius R is measured from profiles of dark dot-shaped contrasts indicating threading dislocations of the first inspection image 120 and the second inspection image 121.

FIG. 9B shows a line profile 124 of the contrast 122b indicating the threading screw dislocation and a line profile 125 of the contrast 123a indicating the threading edge dislocation. The R of the width (2R) 127 in the line profile 124 is 325 nm, and the R of the width (2R) 129 in the line profile 125 is 180 nm. In this case, the longitudinal axis of the line profiles 124 and 125 represents a defect SN, and this is defined by [normal portion (background) brightness–defect portion brightness]/[standard deviation of brightness of normal portion].

By using R measured in FIG. 9B, the ionization energy $E_0$ of electron trap is found. From FIG. 10B, $E_0$ is given by equation (1).

[Equation 1]

$$E_0 = \Delta E_{FT} + \Delta E_{CF} + q\phi \quad (1)$$

In this case, $\Delta E_{FT}$ represents an energy difference 161 between the Fermi level 160 and the trap defect level (Ed) 162, $\Delta E_{CF}$ represents an energy difference 163 between the Fermi level 160 and a conduction band 156, and $q\phi$ is a potential barrier 159. Note that 157 denotes a valence band. $\Delta E_{CF}$ is given by equation (2).

[Equation 2]

$$\Delta E_{CF} = \frac{E_g}{2} - kT\ln\frac{N_d}{n_i} \quad (2)$$

Here, when substituted by the band gap of silicon carbide $E_g=3.26$ eV, the impurity concentration $N_d=7.85\times10^{14}/cm^3$, the true carrier concentration $n_i=8.2\times10^{-9}/cm^3$ and T=300K, $\Delta E_{CF}=0.26$ eV is obtained. The linear charge density $Q_0$ of electrons trapped in the dislocation core (=Q/a) is given by equation (3) based on charge neutralization conditions.

[Equation 3]

$$Q_0 = qN_D\pi R^2 \quad (3)$$

$\Delta E_{FT}$ is given by equation (4), and $q\phi$ is given by equation (5).

[Equation 4]

$$\Delta E_{FT} = \frac{Q_0}{4\pi\varepsilon\varepsilon_0}\left[3\ln\left(\frac{Q_0}{q^3\sqrt{\pi N_D}}\right) - 0.232\right] \quad (4)$$

[Equation 5]

$$q\phi = \frac{Q_0}{4\pi\varepsilon\varepsilon_0}\left[3\ln\left(\frac{Q_0}{q^3\sqrt{\pi N_D}}\right) - 1.232\right] \quad (5)$$

In this way, the potential barrier of the threading screw dislocation (contrast 122b) of 0.29 eV and the potential barrier of the threading edge dislocation (contrast 123a) of 0.05 eV are obtained. The above-mentioned results are output to the defect electric characteristic output 143 of the second defect group of the GUI 36 shown in the aforementioned FIG. 3, and effectively used for the element designing simulation, so that the rated current and rated voltage can be designed.

<Manufacturing Method of Semiconductor Element>

Next, a manufacturing method of a semiconductor element by the use of the aforementioned semiconductor inspection device 1 and semiconductor inspection method shown in FIG. 1 to FIG. 10 will be described with reference to FIG. 11 to FIG. 13. More specifically, a manufacturing method of a silicon carbide semiconductor element free from characteristic influences due to defects will be described.

Figure 11:
FIG. 11 is an explanatory view showing one example of a manufacturing method of a semiconductor element using the semiconductor inspection device of FIG. 1 and the semiconductor inspection method of FIG. 2.
Figure 11:
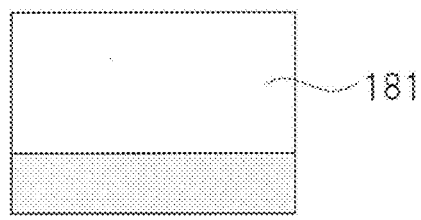
Figure 11:
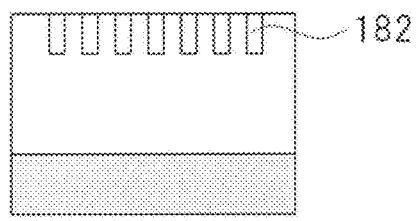
Figure 12:
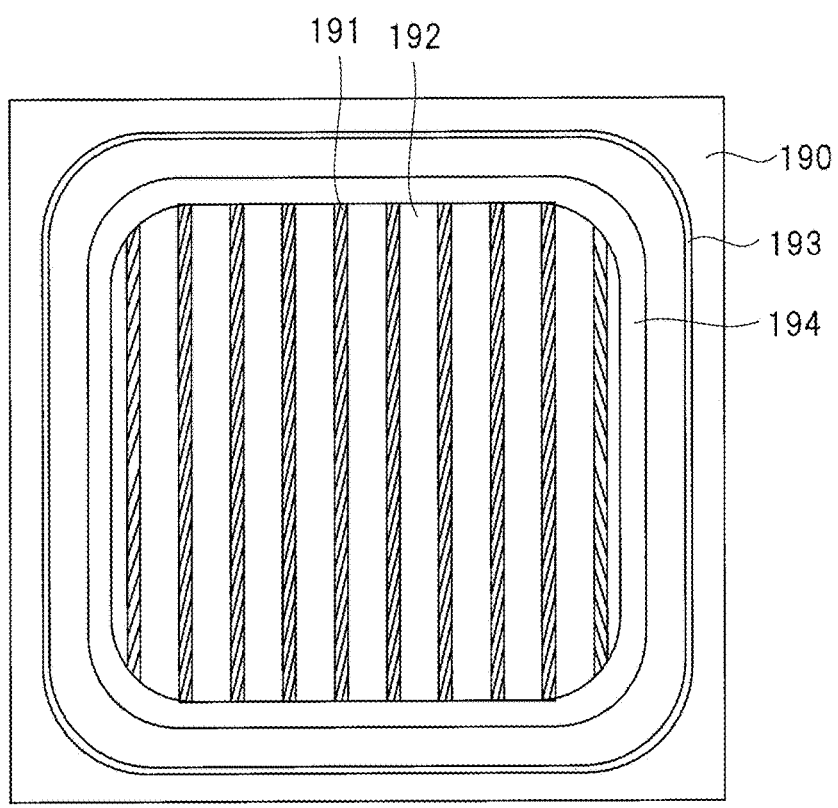
FIG. 12 is an explanatory view showing one example of a die in the manufacturing method of a semiconductor element of FIG. 11.

FIG. 11 is an explanatory view showing one example of a manufacturing method of a semiconductor element. FIG. 12 is an explanatory view showing one example of a die. FIG. 13 is an explanatory view showing one example of a defect distribution of the first defect group.

In the manufacturing method of a semiconductor element of FIG. 11, first, a first inspection process for acquiring a defect distribution of the first defect group is carried out for an n-type silicon carbide wafer 180 by the use of the aforementioned semiconductor inspection device of FIG. 1 and semiconductor inspection method of FIG. 2.

Next, an n⁻-type silicon carbide epitaxial layer 181 is formed on the surface of the n-type silicon carbide wafer 180 by a chemical vapor deposition method or the like. A second inspection process for acquiring the defect distribution of the first defect group is carried out for the silicon carbide epitaxial layer 181 by the use of the aforementioned semiconductor inspection device of FIG. 1 and semiconductor inspection method of FIG. 2. Here, the fact that the basal plane detects are reduced among the defects of the silicon carbide wafer 180 is confirmed. At this time, if the basal plane defects are the same or increased, the epitaxial growth conditions are altered.

Moreover, in the case where the manufacturing process of the semiconductor element is started from a wafer with an epitaxial layer formed thereon, the defect distribution of the first defect group is acquired in the second inspection process, and the aforementioned non-defective rate described with reference to FIG. 7B is acquired based on the die size. The wafers whose non-defective rate does not meet the provision are not used for the manufacture. Preferably, the non-defective rate is 90% or more. In other words, the size of dies is desirably set so that the defective dies become 10% or less.

Next, in order to inactivate the defects of the epitaxial layer, a p-type impurity implanted region 182 is formed in the n⁻-type silicon carbide epitaxial layer 181 by the ion implantation or the like. FIG. 12 shows one example of a die corresponding to the semiconductor element formed in this manner. In FIG. 12, a reference character 190 denotes a die, 191 denotes a p-type impurity implanted region, 192 denotes an n drift layer, 193 denotes an n-type channel stopper, and 194 denotes a p-type guard ring. By using the aforementioned semiconductor inspection device and semiconductor inspection method of FIGS. 1 to 10, the defect distribution of the first defect group and the second defect group of the n⁻-type drift layer 192 serving as an active layer is acquired.

FIG. 13 shows one example of the defect distribution of the first defect group. In one portion 210 of the inspection result of the first defect group shown in FIG. 13, a basal plane defect 204 is detected in an active region 205 in a die 200, and so the die 200 is determined as a defective die. The defective die refers to a bad die to be screened as a defective element. Since a macro defect 206 is detected in an active region 207 in a die 201, the die 201 is determined as the defective die. Since a basal plane defect 208 is detected in an impurity region 209 in a die 202, the die 202 is determined as a normal die. Since no defect of the first defect group is detected in the active region in a die 203, the die 203 is determined as a normal die. Note that it is desirable that the p-type guard ring 194 and the n-type channel stopper 193 have no defects of the first defect group. The defective die or normal die is determined in accordance with the rated voltage of a semiconductor element. The defective die is screened as a defective element in a dicing process after the manufacture of the semiconductor element, so that a post process such as a burn-in inspection can be omitted.

<Semiconductor Inspection Device Using Scanning Electron Microscope>

Next, a semiconductor inspection device using a scanning electron microscope in the aforementioned semiconductor inspection device 1 and semiconductor inspection method of FIG. 1 to FIG. 10 will be described.

In the aforementioned semiconductor inspection device shown in FIG. 1, the scanning electron microscope provided with an electron backscattering pattern detector, an X-ray detector and a processing converged ion beam is provided, and defect observation and physical analyses thereof can be carried out by the use of the aforementioned semiconductor inspection method of FIG. 3 to FIG. 10. In this embodiment, it is possible to specify defects in a non-destructive manner and cut-out the defect portions by the processing converged ion beam, and further analyze the structure by the transmission electron microscope.

Effects of Present Embodiment

By the semiconductor inspection method, the semiconductor inspection device and the manufacturing method of a semiconductor element according to the present embodiment described above, a plurality of kinds of defects formed on the wafer 21 can be detected and discriminated, and dies to be screened can be extracted by specifying the defects having high degree of importance and coordinates thereof. Namely, it is possible to provide an inspection method and an inspection device by which the size and coordinates of a killer defect, the density of threading dislocations and whether or not the threading dislocation is a killer defect can be measured in a non-destructive manner and defective dies can be screened in a pre-process in the manufacture of a semiconductor element, and further provide a manufacturing method of a semiconductor element which gives no influence to element characteristics due to the defects. More specifically, the following effects can be obtained.

(1) Through the process from the inspection image acquisition (S46) to the defect classification (S49), the overall control unit 37 selects an incident energy Ep and a negative potential VN and makes the control so that the primary electrons 9 scan the inspection surface of the wafer 21 to detect the secondary electrons 10. Then, in the image processing unit 30, the first inspection image obtained by the control of the overall control unit 37 is acquired, and a macro defect, stacking faults, a basal plane dislocation and a threading dislocation contained in the first inspection image can be discriminated by the image processing based on the threshold value of the signal amount of the secondary electrons 10 determined in advance.

(2) Through the process of the defect distribution map formation (S50) and others, in the image processing unit 30, the macro defect, the stacking faults and the basal plane dislocation are classified as a first defect group, and the threading dislocation is classified as a second defect group, so that the wafer in-plane distribution of the first defect group and the wafer in-plane distribution of the second defect group can be output.

(3) Through the process of the defect coordinate extraction (S48) and others, in the image processing unit 30, a region in which the first defect group is contained can be specified with respect to the regions formed by dividing a wafer into a lattice pattern.

(4) Through the process from the inspection image acquisition (S46) to the defect classification (S49), the overall control unit 37 selects an incident energy Ep and a positive potential VP and makes the control so that the primary electrons 9 scan the inspection surface of the wafer 21 to detect the secondary electrons 10. Then, in the image processing unit 30, the second inspection image obtained by the control of the overall control unit 37 is acquired, and a threading screw dislocation of a dot-shaped figure contained in the second inspection image can be discriminated by the image processing based on the threshold value of the signal amount of the secondary electrons 10 determined in advance.

(5) Through the process of the defect classification (S49) and others, in the image processing unit 30, the dot-shaped figure of the first inspection image and the dot-shaped figure of the second inspection image are compared with each other, so that the threading screw dislocation and threading edge dislocation can be discriminated.

(6) Through the process of the defect analysis (S51) and others, in the image processing unit 30, the charge capturing density $Q_0$ and the barrier potential $q\phi$ of threading dislocation can be output based on a signal profile of secondary electrons of a dot-shaped figure.

(7) Through the process of the defect coordinate extraction (S48), the defect classification (S49) and others, in the image processing unit 30, with respect to a layout set in the wafer die region having a lattice pattern based on mask information of a semiconductor element, a macro defect, stacking faults and a basal plane dislocation in a predetermined region of this layout can be discriminated.

(8) Through the process from the inspection image acquisition (S46) to the inspection result output (S52), dies containing a macro defect, stacking faults and a basal plane dislocation are specified and the specified dies can be screened.

(9) Through the process from the inspection image acquisition (S46) to the inspection result output (S52), dies in which the macro defect, stacking faults and basal plane dislocation have been detected in the active region of the layout can be screened.

(10) Through the process from the inspection image acquisition (S46) to the inspection result output (S52), the size of the die can be determined so as to reduce defective dies containing the macro defect, stacking faults and basal plane dislocation to 10% or less.

In the foregoing, the invention made by the inventors of the present invention has been concretely described based on the embodiments. However, it is needless to say that the present invention is not limited to the foregoing embodiments and various modifications and alterations can be made within the scope of the present invention. For example, the embodiments above have been described in detail so as to make the present invention easily understood, and the present invention is not limited to the embodiment having all of the described constituent elements. Also, another configuration may be added to a part of the configuration of each embodiment, and a part of the configuration of each embodiment may be eliminated or replaced with another configuration.

[Additional Note]

The semiconductor inspection device of the present invention is also provided with the following characteristics. Additionally, the semiconductor inspection method is also provided with the same characteristics.

(1) A semiconductor inspection device includes:

a charged particle gun which generates a charged particle beam;

a sample holder which supports a sample;

a deflection unit which scans a sample surface with the charged particle beam;

a detector which detects secondary electrons generated by irradiating the sample with the charged particle beam;

an image processing unit which processes an output from the detector as an image;

a sample potential control unit which controls a potential of the sample;

a counter electrode provided between the sample and an objective lens;

a power supply unit which applies a positive potential or a negative potential determined based on the potential of the sample to the counter electrode;

a yield calculation unit which calculates a secondary electron yield based on the charged particle beam and a current amount of the secondary electrons;

a calculation unit which calculates an incident energy that makes the secondary electron yield greater than 1, the negative potential that makes the secondary electron yield smaller than 1 and the positive potential that makes the secondary electron yield greater than 1 at the incident energy based on the output of the yield calculation unit; and a control unit which controls the incident energy and the application of the positive potential or the negative voltage to the counter electrode depending on measuring conditions of the sample.

(2) The semiconductor inspection device according to the above-mentioned (1) further includes:

an inspection item input unit to which kinds of macro defects or crystal defects of the sample are input as the measuring conditions of the sample, the control unit controls the incident energy and the application of the positive potential or the negative potential to the counter electrode relative to the charged particle beam based on the above-mentioned input, and the image processing unit determines a macro defect and a crystal defect of the sample and determine a fatal defect (killer defect) based on a plurality of images obtained by the above-mentioned control.

(3) In the semiconductor inspection device according to the above-mentioned (2), the above-mentioned sample is a single crystal wafer or a wafer with an epitaxial layer formed thereon, and the above-mentioned image processing unit quantifies and outputs quality of the wafer based on the determination result of the fatal defect of the sample.

(4) The semiconductor inspection device according to the above-mentioned (1) further includes:

a GUI which carries out input/output operations, and the GUI is provided with:

a first input unit which divides the wafer into dies and specifies die numbers; a second input unit which inputs mask information; a third input unit which inputs an impurity concentration of the wafer; a first output unit which classifies defects into a first defect group and a second defect group from the wafer inspection and outputs the results; a second output unit which outputs coordinates and a size of the first defect group; a third output unit which extracts dies which are specified by the first input unit and in which coordinates of the first defect group are contained; a fourth output unit which outputs a defect density of the second defect group in the die specified by the first input unit; a fifth output unit which analyzes electric characteristics of the second defect group from a profile of the image of the second defect group obtained by inspecting the secondary electrons and outputs the result; and a sixth output unit which extracts the dies to be screened based on the mask information specified by the second input unit and based on the output of the fifth output unit.

EXPLANATION OF REFERENCE CHARACTERS

1 . . . semiconductor inspection device, 2 . . . electron optical system, 4 . . . wafer transporting system, 5 . . . vacuum exhaust system, 6 . . . control system, 7 . . . image processing system, 8 . . . operation unit, 9 . . . primary electrons, 10 . . . secondary electrons (or reflected electrons), 11 . . . electron gun, 12 . . . condenser lens, 13 . . . objective lens, 14 . . . detector, 15 . . . deflector, 16 . . . counter electrode, 19 . . . XY stage, 20 . . . wafer holder, 21 . . . wafer, 22 ... electron beam control unit, 23 ... detection system control unit, 24 ... deflection control unit, 25 ... electron lens control unit, 26 ... retarding voltage control unit, 27 ... electrode control unit, 30 ... image processing unit, 31 ... image storage unit, 33 ... reflection plate, 34 ... optical microscope, 36 ... GUI, 37 ... overall control unit, 38 ... calculation unit, S40 ... input process of inspection information, S41 ... wafer load process, S42 ... electron optical condition setting process, S43 ... electron beam adjusting process, S44 ... wafer alignment process, S45 ... calibration process, S46 ... inspection image acquiring process, S47 ... inspection processing image output process, S48 ... defect coordinate extraction process, S49 ... defect classifying process, S50 ... defect distribution map forming process, S51 ... defect analyzing process, S52 ... inspection result output process, S53 ... wafer unload process, 61 ... secondary electron emission detection voltage under VP condition, 62 ... secondary electron emission detection voltage under VN condition, 63 ... reference energy E2, 64 ... secondary electron yield curve, 65 ... reference energy E1, 70 ... inspection wafer, 71 ... die, 72 ... first orientation flat, 73 ... second orientation flat, 74 ... electron beam scanning direction, 75 ... stage moving direction, 80 ... stacking fault, 81 ... basal plane dislocation, 82 ... threading dislocation, 83 ... polygonal figure indicating stacking fault, 84 ... dot-shaped figure indicating basal plane dislocation, 85 ... dot-shaped figure indicating threading dislocation, 86 ... optical microscopic image, 87 ... end portion of macro defect, 88 ... macro defect, 89 ... bottom portion of macro defect, 90 ... apex portion of macro defect, 91a ... first inspection image of apex portion of macro defect, 91b ... first inspection image of bottom portion of macro defect, 101 ... defect distribution of first defect group, 102 ... macro defect, 103 ... basal plane dislocation, 104 ... die containing no defect of first defect group, 105 ... die containing defects of first defect group, 110 ... defect distribution of second defect group, 111 ... die, 112 ... enlarged view of defect distribution of die, 113 ... threading dislocation, 120 ... first inspection image, 121 ... second inspection image, 122a ... contrast indicating threading edge dislocation, 122b ... contrast indicating threading screw dislocation, 123a ... contrast indicating threading edge dislocation, 123b ... contrast indicating threading screw dislocation, 124 ... profile of contrast of threading dislocation of first inspection image, 125 ... profile of contrast of threading dislocation of second inspection image, 127 ... width of profile, 129 ... width of profile, 130 ... inspection information, 131a ... first defect group inspection item input column, 131b ... second defect group inspection item input column, 132 ... sample information input column, 133 ... inspection item input column, 134 ... inspection region setting column, 135 ... die, 136 ... die layout information setting column, 137a ... wafer composition, 137b ... wafer size, 137c ... structure, 137d ... impurity concentration, 140 ... defect density result output, 141 ... defect distribution output of first defect group, 142 ... defect distribution output of second defect group, 143 ... defect electric characteristic output of second defect group, 150 ... threading dislocation, 151 ... donor ion, 152 ... electron, 153 ... depletion radius, 154 ... electron captured by dislocation, 155 ... average interval of electrons captured by dislocation, 156 ... conduction band, 157 ... valence band, 158 ... electron captured by defect level, 159 ... potential barrier, 160 ... fermi level, 161 ... energy difference between fermi level and trap level, 162 ... defect level, 163 ... energy difference between conduction band and fermi level, 180 ... silicon carbide wafer, 181 ... n$^-$-type silicon carbide epitaxial layer, 182 ... p-type impurity implanted region, 190 ... die, 191 ... p-type impurity implanted region, 192 ... n$^-$drift layer, 193 ... n-type channel stopper, 194 ... p-type guard ring, 200 ... die containing basal plane defect in active region, 201 ... die containing macro defect in active region, 202 ... die containing basal plane defect and macro defect in impurity region, 203 ... die containing no defect of first defect group, 204 ... basal plane defect, 205 ... active region, 206 ... macro defect, 207 ... active region, 208 ... basal plane defect, 209 ... impurity region, 210 ... part of inspection results of first defect group

The invention claimed is:

1. A semiconductor inspection method, which inspects a semiconductor wafer by using a semiconductor inspection device that inspects the semiconductor wafer by carrying out an image processing by detecting secondary electrons generated by irradiating the semiconductor wafer with a charged particle beam, the semiconductor wafer being a single crystal wafer or a wafer with an epitaxial layer formed thereon, the method comprising:

a first step of applying a positive potential or a negative potential determined based on a potential of the semiconductor wafer to a counter electrode provided between the semiconductor wafer and an objective lens;

a second step of calculating a secondary electron yield based on the charged particle beam and a current amount of the secondary electrons;

a third step of determining an incident energy that makes the secondary electron yield greater than 1, the negative potential that makes the secondary electron yield smaller than 1 and the positive potential that makes the secondary electron yield greater than 1 at the incident energy;

a fourth step of selecting the incident energy and the negative potential;

a fifth step, which is carried out after the fourth step, of scanning an inspection surface of the semiconductor wafer with the charged particle beam to detect the secondary electrons; and a sixth step of acquiring a first inspection image obtained in the fifth step and discriminating a macro defect, stacking faults, a basal plane dislocation and a threading dislocation contained in the first inspection image based on a threshold value of a signal amount of the secondary electrons determined in advance.

2. The semiconductor inspection method according to claim 1, wherein in the sixth step, the macro defect, the stacking faults and the basal plane dislocation are classified as a first defect group and the threading dislocation is classified as a second defect group, and an in-plane distribution of the first defect group of the semiconductor wafer and an in-plane distribution of the second defect group of the semiconductor wafer are output.

3. The semiconductor inspection method according to claim 2, wherein in the sixth step, with respect to regions formed by dividing the semiconductor wafer into a lattice pattern, a region containing the first defect group is specified.

4. The semiconductor inspection method according to claim 1,
wherein in the fourth step, the incident energy and the positive potential are selected,
in the fifth step executed after the fourth step, by scanning the inspection surface of the semiconductor wafer with the charged particle beam, the secondary electrons are detected, and
in the sixth step, a second inspection image obtained in the fifth step is acquired, and a threading screw dislocation having a dot-shaped figure contained in the second inspection image is discriminated based on a threshold value of a signal amount of the secondary electrons determined in advance.

5. The semiconductor inspection method according to claim 4,
wherein in the sixth step, by comparing the dot-shaped figure of the first inspection image and the dot-shaped figure of the second inspection image with each other, the threading screw dislocation and the threading edge dislocation are discriminated.

6. The semiconductor inspection method according to claim 5,
wherein in the sixth step, from a signal profile of the secondary electrons of the dot-shaped figure, a charge capturing density and a barrier potential of the threading dislocation are output.

7. The semiconductor inspection method according to claim 1,
wherein in the sixth step, with respect to a layout set in a die region having a lattice pattern of the semiconductor wafer based on mask information of a semiconductor element, the macro defect, the stacking faults and the basal plane dislocation in a predetermined region of the layout are discriminated.

8. A manufacturing method of a semiconductor element using a single crystal wafer or a wafer with an epitaxial layer formed thereon, comprising the steps of:
setting die regions having a lattice pattern in the wafer; and
specifying dies containing the macro defect, the stacking faults and the basal plane dislocation and screening the specified dies by using the semiconductor inspection method according to claim 1.

9. The manufacturing method of a semiconductor element according to claim 8,
wherein dies in which the macro defect, the stacking faults and the basal plane dislocation are detected in an active region of a layout set in the die regions of the wafer having the lattice pattern based on mask information of the semiconductor element are screened.

10. The manufacturing method of a semiconductor element according to claim 8,
wherein a size of the die is determined so as to reduce defective dies containing the macro defect, the stacking faults and the basal plane dislocation to 10% or less.

11. A semiconductor inspection device comprising:
a charged particle gun which generates a charged particle beam;
a sample holder which supports a sample;
a deflection unit which scans a sample surface with the charged particle beam;
a detector which detects secondary electrons generated by irradiating the sample with the charged particle beam;
an image processing unit which processes an output from the detector as an image;
a sample potential control unit which controls a potential of the sample;
a counter electrode provided between the sample and an objective lens;
a power supply unit which applies a positive potential or a negative potential determined based on the potential of the sample to the counter electrode;
a yield calculation unit which calculates a secondary electron yield based on the charged particle beam and a current amount of the secondary electrons;
a calculation unit which calculates an incident energy that makes the secondary electron yield greater than 1, the negative potential that makes the secondary electron yield smaller than 1 and the positive potential that makes the secondary electron yield greater than 1 at the incident energy based on an output of the yield calculation unit; and
a control unit which controls the incident energy and an application of the positive potential or the negative potential to the counter electrode depending on measuring conditions of the sample,
wherein the sample is a single crystal wafer or a wafer with an epitaxial layer formed thereon,
the control unit controls the charged particle beam so as to have the incident energy and apply the negative potential to the counter electrode, and scans an inspection surface of the sample with the charged particle beam to detect the secondary electrons, and
the image processing unit acquires a first inspection image obtained by the control of the control unit, and discriminates a macro defect, stacking faults, a basal plane dislocation and a threading dislocation contained in the first inspection image based on a threshold value of a signal amount of the secondary electrons determined in advance.

12. The semiconductor inspection device according to claim 11,
wherein the image processing unit classifies the macro defect, the stacking faults and the basal plane dislocation as a first defect group and classifies the threading dislocation as a second defect group, and outputs an in-plane distribution of the first defect group of the sample and an in-plane distribution of the second defect group of the sample.

13. The semiconductor inspection device according to claim 11,
wherein the control unit controls the charged particle beam so as to have the incident energy and apply the positive potential to the counter electrode, and scans the inspection surface of the sample with the charged particle beam to detect the secondary electrons, and
the image processing unit acquires a second inspection image obtained by the control of the control unit, and discriminates a threading screw dislocation of a dot-shaped figure contained in the second inspection image based on a threshold value of a signal amount of the secondary electrons determined in advance.

14. The semiconductor inspection device according to claim 13,
wherein the image processing unit discriminates the threading screw dislocation and the threading edge dislocation by comparing a dot-shaped figure of the first inspection image and the dot-shaped figure of the second inspection image with each other.

15. The semiconductor inspection device according to claim 14,
wherein the image processing unit outputs a charge capturing density and a barrier potential of the threading dislocation based on a signal profile of the secondary electrons of the dot-shaped figure.

* * * * *